US012808923B2

(12) United States Patent
Gohel et al.

(10) Patent No.: US 12,808,923 B2
(45) Date of Patent: Nov. 24, 2026

(54) ANALYZING TRANSMISSION LINES

(71) Applicant: Teradyne, Inc., North Reading, MA (US)

(72) Inventors: Tushar Gohel, Winchester, MA (US); Zachary Farrer, Boston, MA (US); Stephen J Bourassa, Tewksbury, MA (US)

(73) Assignee: Teradyne, Inc., North Reading, MA (US)

( * ) Notice: Subject to any disclaimer, the term of this patent is extended or adjusted under 35 U.S.C. 154(b) by 130 days.

(21) Appl. No.: 18/525,269

(22) Filed: Nov. 30, 2023

(65) Prior Publication Data

US 2025/0180629 A1 Jun. 5, 2025

(51) Int. Cl.
*G01R 31/28* (2006.01)
*G01R 31/317* (2006.01)
*H04B 17/16* (2015.01)

(52) U.S. Cl.
CPC ..... *G01R 31/2822* (2013.01); *G01R 31/2834* (2013.01); *G01R 31/31715* (2013.01); *H04B 17/16* (2015.01)

(58) Field of Classification Search
CPC .......... G01R 31/2834; G01R 31/31715; G01R 31/11; G01R 31/2812; H04B 17/16
USPC ......................... 324/645, 523, 525, 533, 333
See application file for complete search history.

(56) References Cited

U.S. PATENT DOCUMENTS

| | | | |
|---|---|---|---|
| 4,734,637 | A | 3/1988 | Chen et al. |
| 6,563,352 | B1 | 5/2003 | Gohel et al. |
| 6,868,357 | B2 | 3/2005 | Furse |
| 6,885,954 | B2 | 4/2005 | Jones et al. |
| 6,894,505 | B2 | 5/2005 | Gohel |
| 6,937,944 | B2 | 8/2005 | Furse et al. |
| 7,069,163 | B2 | 6/2006 | Gunther et al. |
| 7,075,309 | B2 | 7/2006 | Smith |
| 7,165,200 | B2 | 1/2007 | Jani et al. |
| 7,215,126 | B2 | 5/2007 | Furse et al. |
| 7,250,772 | B2 | 7/2007 | Furse et al. |
| 7,271,596 | B2 | 9/2007 | Furse et al. |
| 7,282,922 | B2 | 10/2007 | Lo et al. |
| 7,495,450 | B2 | 2/2009 | Furse et al. |
| 7,548,071 | B2 | 6/2009 | Harrison et al. |
| 7,622,931 | B2 | 11/2009 | Wu et al. |
| 7,634,012 | B2 | 12/2009 | Farhang-Boroujeny et al. |

(Continued)

FOREIGN PATENT DOCUMENTS

| | | | |
|---|---|---|---|
| WO | 2019/022919 | A1 | 1/2019 |
| WO | 2022/234704 | A1 | 11/2022 |

OTHER PUBLICATIONS

Translation Document EP1477820A2 (Year: 2004).*

(Continued)

*Primary Examiner* — Roberto Velez

(74) *Attorney, Agent, or Firm* — ARENTFOX SCHIFF LLP

(57) ABSTRACT

Example automatic test equipment (ATE) includes a transmitter to output a waveform to a transmission line; circuitry to detect data for the waveform on the transmission line, with the circuitry being configured to scan the waveform across a range of times and across a range of voltages to obtain the data for the waveform; and memory to store the data detected by the circuitry.

34 Claims, 17 Drawing Sheets

(56) References Cited

U.S. PATENT DOCUMENTS

| | | | | |
|---|---|---|---|---|
| 8,222,906 | B2 * | 7/2012 | Wyar | G01R 31/11 324/533 |
| 8,310,270 | B2 | 11/2012 | Gohel et al. | |
| 8,914,566 | B2 | 12/2014 | Vandervalk et al. | |
| 9,164,158 | B2 * | 10/2015 | Johnson | G01R 31/3191 |
| 9,244,117 | B2 | 1/2016 | Furse et al. | |
| 10,250,957 | B2 | 4/2019 | Gohel et al. | |
| 10,404,363 | B2 | 9/2019 | Gohel et al. | |
| 10,404,364 | B2 | 9/2019 | Gohel et al. | |
| 10,504,307 | B2 | 12/2019 | Courter et al. | |
| 10,523,316 | B2 | 12/2019 | Gohel et al. | |
| 10,564,219 | B2 | 2/2020 | Gohel et al. | |
| 10,715,250 | B2 | 7/2020 | Gohel et al. | |
| 10,732,222 | B2 | 8/2020 | Peschke et al. | |
| 12,504,459 | B2 | 12/2025 | Gohel et al. | |
| 2003/0093713 | A1 * | 5/2003 | Werner | G01R 31/31715 714/25 |
| 2006/0161827 | A1 * | 7/2006 | Gohel | G01R 31/31924 714/736 |
| 2006/0182269 | A1 | 8/2006 | Lo et al. | |
| 2013/0106399 | A1 | 5/2013 | Gohel et al. | |
| 2013/0110445 | A1 | 5/2013 | Kaushansky et al. | |
| 2013/0110446 | A1 | 5/2013 | Bourassa et al. | |
| 2013/0124134 | A1 | 5/2013 | Gohel | |
| 2017/0146332 | A1 * | 5/2017 | Spehlmann | G01R 31/3191 |
| 2018/0316420 | A1 * | 11/2018 | Gohel | G01R 31/00 |
| 2019/0033372 | A1 | 1/2019 | Gohel et al. | |
| 2021/0302224 | A1 | 9/2021 | Yang et al. | |
| 2021/0350237 | A1 | 11/2021 | Litichever et al. | |
| 2022/0050013 | A1 | 2/2022 | Champavere | |
| 2023/0086626 | A1 | 3/2023 | Pulikottil et al. | |
| 2025/0180623 | A1 | 6/2025 | Gohel et al. | |

OTHER PUBLICATIONS

Foreign Priority Translation Document (Year: 2008).*

International Search Report and Written Opinion received for PCT Patent Application No. PCT/US2024/057337, mailed on Mar. 12, 2025, 12 pages.

Furse et al., "A critical comparison of reflectometry methods for location of wiring faults," Smart Structures and Systems, vol. 2, No. 1, pp. 25-46 (2006), 22 pages.

Furse et al., "Feasibility of Spread Spectrum Sensors for Location of Arcs on Live Wires," IEEE Sensors Journal, vol. 5, No. 6, pp. 1445-1450 (2005), 6 pages.

Furse et al., "Spread spectrum sensors for critical fault location on live wire networks," Structural Control and Health Monitoring 12:257-267 (2005), 11 pages.

LiveWire company overview, "Patented technology for monitoring, detecting and locating electrical faults in live systems," LiveWire Innovation, Inc. (Mar. 23, 2016), 1 page.

LiveWire Innovation, "Sentinel 100 SSTDR Engine LW-S100: Live Monitoring of Electrical Systems for the Detection and Location of Faults," [online] Retrieved from the Internet <URL: https://www.livewireinnovation.com/sstdr/> (2018), 7 pages.

LiveWire Innovation, "Sentinel 100 SSTDR Engine: Live Monitoring for the Detection and Location of Faults in Cables and Wires," LiveWire Innovation, Inc. (2017), 2 pages.

Reis et al, "Sequence and Spread Spectrum Time Domain Reflectometry for Transmission Line Analysis," Conference Proceedings of SPIE (Sep. 2007), 11 pages.

Sharma et al., "Low-Power STDR CMOS Sensor for Locating Faults in Aging Aircraft Wiring," IEEE Sensors Journal, vol. 7, No. 1, pp. 43-50 (2007), 8 pages.

Smith et al., "Analysis of Spread Spectrum Time Domain Reflectometry for Wire Fault Location," IEEE Sensors Journal, vol. 5, No. 6, pp. 1469-1478 (2005), 10 pages.

Stephenson, J., "Eliminating False Positives in the Detection and Location of sub 3ms Faults on AC/DC Lines," LiveWire Test Labs, Inc. (Apr. 11, 2011), 8 pages.

International Search Report and Written Opinion received for PCT Patent Application No. PCT/US2024/057343, mailed on Mar. 24, 2025, 9 pages.

* cited by examiner

ANALYZING TRANSMISSION LINES

TECHNICAL FIELD

This specification describes example implementations of techniques for configuring automated test equipment to analyze transmission lines.

BACKGROUND

Example time domain reflectometry (TDR) testing includes outputting an electrical signal containing an incident edge onto a transmission line, measuring the incident edge and a reflection of the incident edge on the transmission line, and determining a signal path length based on a difference between the two measurements. U.S. Pat. No. 4,734,637, titled "Apparatus For Measuring The Length Of An Electrical Line", describes an example TDR implementation.

SUMMARY

Example automatic test equipment (ATE) includes a transmitter to output a waveform to a transmission line; and circuitry to detect data for the waveform on the transmission line, with the circuitry being configured to scan the waveform across a range of times and across a range of voltages to obtain the data for the waveform; and memory to store the data detected by the circuitry. The waveform may be a reflected waveform. The example ATE may include one or more of the following features, either alone or in combination.

The circuitry may be configured to obtain the data at more than one time in the range of times. The circuitry may include delay elements to affect scanning across the range of times and has a threshold that is settable to different values to affect scanning across the range of voltages. The circuitry may be configured to perform operations that include: (a) receiving a value for the threshold; (b) for the value of the threshold that was received, performing operations that include: (i) sampling the waveform at times in the range that are separated by a time period to obtain data for the waveform; (ii) incrementing the times using a delay element to produce incremented times, with the delay element adding a delay to each time, and with the delay being a fraction of the time period; (iii) repeating operations (i) and (ii) a predetermined number of times, each time replacing the times with the incremented times; (c) obtaining an updated value for the threshold; and (d) repeating operations (a) through (c) a predetermined number of times, each time using the updated value for the threshold as the value for the threshold. Operations (a) through (c) may be repeated for values of the threshold that extend at least from a lowest value of the waveform to a highest value of the waveform.

A number of values of the threshold may be less than or less than or equal to, a number of values for the times. A number of values of the threshold may be greater than, or greater than or equal to, a number of values for the times. The circuitry may include a hardware device, the delay elements may include hardware elements in the hardware device, and the threshold may be programmable into the hardware device. The predetermined number of times that operations (i) and (ii) may be repeated may be based on the time period and the delay. The predetermined number of times that operations (i) and (ii) may be repeated may include a number of delays summed to reach the time period minus a single delay.

The ATE may include a test instrument that includes pin electronics associated with a communication channel to a device under test (DUT). The transmitter and the circuitry may be implemented, at least partly, on the pin electronics.

The waveform may have an edge. The ATE may include one or more processing devices configured to perform operations that include: constructing an approximation of the waveform using the data for the waveform from the memory; and identifying an attribute of the transmission line based on the approximation of the waveform. The attribute include the impedance of the transmission line or part of the transmission line. The attribute include a length of the transmission line.

The ATE may include one or more processing devices configured to perform operations that include: constructing an approximation of the waveform using the data for the waveform from the memory; identifying one or more segments of the transmission line based on the data; identifying an attribute for each of the one or more segments; and determining whether each of the one or more segments is within an acceptable tolerance based a corresponding attribute.

The ATE may include one or more processing devices configured to perform operations that include: constructing an approximation of the waveform using the data for the waveform from the memory; analyzing the approximation of the waveform to obtain information about the transmission line; and outputting the information about the transmission line. The information may include at least one of: (i) a location of an open circuit on the transmission line, (ii) a location of a short circuit on the transmission line, (iii) one or more impedances on the transmission line, or iv) a length of the transmission line or a segment of the transmission line.

The circuitry may be configured to detect data for multiple instances of the waveform on the transmission line and to store the data for the multiple instances of the waveform in the memory. The ATE may include one or more processing devices to compare the data for the multiple instances of the waveform based on a test limit and to determine whether there is an intermittent fault on the transmission line based on the comparison.

The ATE may include one or more processing devices configured to perform operations that include: constructing an approximation of the waveform using the data for the waveform from the memory; analyzing the approximation of the waveform to obtain information about the transmission line; and detecting a fault on the transmission line by comparing the information to one or more test limits programmed into the ATE.

The ATE may include multiple transmitters, with each transmitter to output a waveform to a respective transmission line, and with the transmitter being among the multiple transmitters; multiple instances of the circuitry to detect data for a respective waveform on a respective transmission line, with the circuitry being among the multiple instances, and with each instance of the circuitry being configured to scan the respective waveform across a range of times and across a range of voltages to obtain respective data for the respective waveform and to store the respective data in the memory; and one or more processing devices to analyze the respective data for the respective waveforms to attempt to identify at least one of a hard transmission line fault, a crosstalk fault, or an intermittent fault.

The ATE may include one or more processing devices configured to perform operations that include: constructing an approximation of the waveform using the data for the waveform from the memory; and detecting a fault in an interconnect on the transmission line.

Example ATE may include a transmitter to output a waveform to a first transmission line; and circuitry to detect, based on one or more test limits, a disturbance on a second transmission line following output of the waveform on the first transmission line. The first transmission line and the second transmission line are within a physical proximity of each other. The example ATE may include one or more of the following features, either alone or in combination.

Physical proximity may include the first transmission line and the second transmission line being in physical contact with each other. The transmitter may be associated with a first circuit configuration for the first transmission line. The circuitry may be associated with a second circuit configuration for the second transmission line. The disturbance in the second transmission line may be based on the waveform in the first transmission line.

The ATE may include a test instrument that includes pin electronics associated with a communication channel to a device under test (DUT). The transmitter may be implemented on the pin electronics. The ATE may include one or more processing devices to compare data based on the disturbance to a threshold and to output information based on the comparison. The ATE may include an instance of the circuitry electrically connected to the first transmission line.

The ATE may include multiple transmitters and corresponding circuitry associated with different test channels, The ATE may include one or more processing devices to search across data from the corresponding circuitry for the different test channels to identify crosstalk in each channel.

The one or more processing devices may be configured to identify crosstalk on a single channel from multiple channels. The one or more processing devices may be configured to detect crosstalk from multiple channels on the transmission line. The one or more processing devices may be configured to detect crosstalk from a particular combination of channels on the transmission line.

An example method includes outputting first waveforms on first transmission lines; obtaining first data based on one or more disturbances on a second transmission lines following output of the first waveforms on the first transmission lines, with the second transmission line being within a physical proximity of respective ones of the first transmission lines; and reporting one or more faults in the one or more transmission lines based on the first data. The example method may include one or more of the following features, either alone or in combination.

The method may be performed automatically under control of a computing system. The first waveforms may be output successively on different ones of the first transmission lines. The one or more disturbances may appear on second transmission lines that are in proximity to respective ones of the first transmission lines. Reporting may include identifying locations of the one or more faults in the one or more first transmission lines. At least one of obtaining the first data or obtaining the second data may be performed using one or more user-programmable test limits.

Any two or more of the features described in this specification, including in this summary section, may be combined to form implementations not specifically described in this specification.

At least part of the devices, systems, and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the devices, systems, and processes described in this specification may be configured or controlled using a computing system comprised of one or more processing devices and memory storing instructions that are executable by the one or more processing devices to perform various control operations. The devices, systems, and processes described in this specification may be configured, for example, through design, construction, composition, arrangement, placement, programming, operation, activation, deactivation, and/or control.

The details of one or more implementations are set forth in the accompanying drawings and the following description. Other features and advantages will be apparent from the description and drawings, and from the claims.

DESCRIPTION OF THE DRAWINGS

Like reference numerals in different Figures indicate like elements.

DETAILED DESCRIPTION

Figure 1:
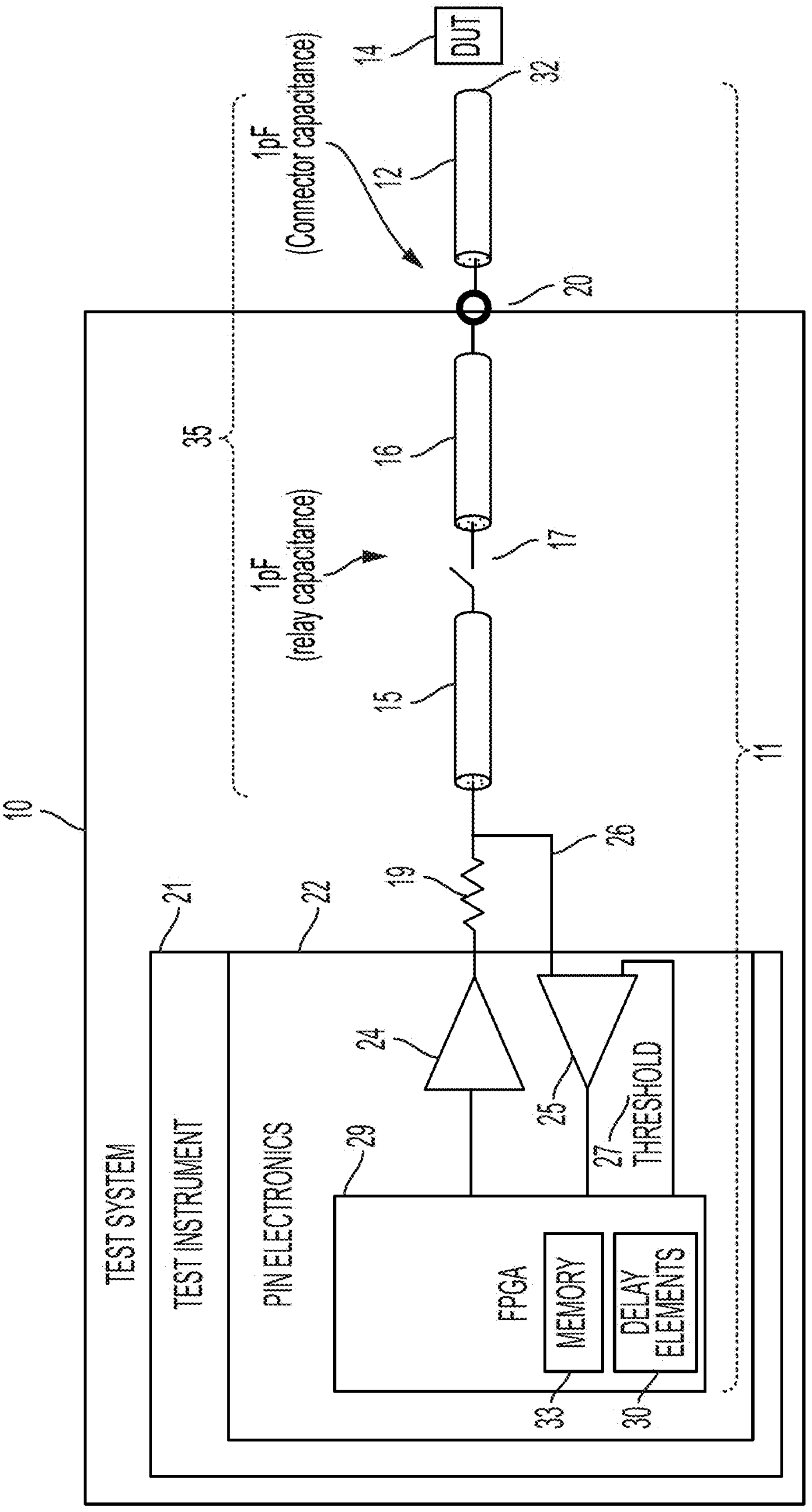
FIG. 1 is a block diagram showing an example test channel of a test system including a transmission line having an open end.

Described herein are example techniques for analyzing transmission lines by performing time domain reflectometry (TDR) testing using test equipment, including pin electronics. The techniques include implementing TDR using both hardware and software components. For example, software is used to set thresholds (also referred to herein as "test limits") with which incident and reflected waveforms on a transmission line are detected. For example hardware, such as delay elements in a field-programmable gate array (FPGA) or other circuitry associated with the pin electronics, are used to set time intervals over which data for the incident and reflected waveforms is sampled. By setting the time intervals using hardware, the time it takes to perform sampling, and the time it takes to obtain large number of samples may be relatively short. Setting the threshold in software enables flexibility in that the thresholds may be set to any value, allowing the techniques to be used with waveforms having varying magnitudes or other characteristics.

The techniques may be applied in parallel—for example, concurrently, simultaneously, or contemporaneously—for multiple transmission lines to determine attributes of multiple transmission lines concurrently, simultaneously, or contemporaneously. The techniques may be applied consecutively for multiple transmission lines to determine attributes of multiple transmission lines consecutively.

Examples of attributes of the transmission lines that may be determined may include, but are not limited to, one or more changes in impedance in the transmission line, one or more impedance mismatches in the transmission line, an open circuit in the transmission line, or a short circuit in the transmission line. Other examples of attributes of the transmission lines that may be determined may include the electrical length of the transmission line itself or the electrical length of individual segments of the transmission line. The electrical length of a transmission line may be in units such as meters or in propagation time (i.e. nanoseconds). In this regard, the electrical length is usually measured in time. The electrical length can be converted to physical length when provided with properties of the transmission line such as its dielectric constant.

Reports may be generated containing attributes detected using the example techniques. The reports may include whether the transmission line passes or fails a given test limit provided by a user. These tests may be automated so that a test system having many channels can be run to quickly determine which transmission lines pass or fail testing based on programmed test limits or thresholds.

The example techniques may also be used to identify crosstalk among transmission lines. Example crosstalk includes electromagnetic interference emitted from one transmission line inducing or producing a signal on another transmission line. Crosstalk measurements may also employ user-programmable test limits or thresholds for testing of the type described herein, as there may be an acceptable amount of crosstalk in a given system.

The testing described herein may be automated by a test system—for example, the testing may be part of a test program. Automated testing allows for quick testing of all channels in a system. Since test limits can be applied for crosstalk as well, the test system can quickly cycle through several combinations of transmitting channels coupling (crosstalking) to receiving channels. Furthermore, sine the transmission line test capabilities described herein are integrated into a test system, a user can get more insight into the cause of failures. If a test fails, it may also be due to the interconnect between the test system and device under test. The test engineer can include testing the interconnect as part of their test program. Also various types of tests described herein (e.g., crosstalk, opens/shorts detection, and intermittent faults) can be performed simultaneously on multiple channels in various combinations in accordance with user programming.

An example transmission line includes any type of cable, wire, printed circuit board (PCB) microstrip or stripline, or other type of electrically-conductive medium capable of transmitting electrical signals. An electrical signal as used herein also includes, but is not limited to, an electromagnetic wave. A transmission line may include an assembly comprised of two or more such cables, wires, PCB microstrips or striplines, or other type of electrically conductive media connected using one or more electrical connectors. A single transmission line may include different types of cable(s), wire(s), PCB striplines and microstrips and/or electrically-conductive media connected by connectors, relays, or other devices.

FIG. 1 shows an example test system 10, other examples of which are also described herein, having a test channel 11 that includes a transmission line 12. In this example, transmission line 12 extends between test system 10 and a device under test (DUT) 14 to be tested by the test system. The DUT may be any small-scale or large-scale electronic device or system such as, but not limited to, avionics in an airplane, operating electronics in a tank, or a computer chip such as a microprocessor, or radio frequency (RF) transmitter or receiver. There may be multiple—for examples, hundreds or thousands—of test channels like test channel 11 between test instrument 10 and corresponding DUTs. There may be one test channel per DUT, for example. There may be one test channel per DUT pin or connection, for example.

In this example, test channel 11 includes a first microstrip 15 and a second microstrip 16 connected together by a relay 17 having an example capacitance of 1 picofarad (pF). An example microstrip is a type of transmission line that includes an electrical conductor fabricated on dielectric substrate with a grounded plane.

In this example, test channel 11 also includes one or more resistors 19. In some implementations, resistor 19 may be omitted or other passive circuit element(s) that provide impedance may be used in place of resistor 19.

In this example, transmission line 12 includes a coaxial cable connected to second microstrip 16 by an electrical connector 20 having a 1 pF connector capacitance. A coaxial cable is a type of transmission line that includes an inner conductor surrounded by a concentric conducting shield, with the two separated by a dielectric. One or more other types of cables, wires, and/or electrically-conductive media may be included in transmission line 12. Furthermore, transmission line 12 and test system 19 are not limited to use with connectors or relays, nor is test channel 11 limited to connectors or relays having 1 pF values. Those are examples only.

Test system 10 also includes one or more test instruments 21. Although only one test instrument 21 is shown in FIG. 1, test system 10 may include multiple test instruments to test different types of DUTs. Examples of specialized test instruments include RF test instruments, digital test instruments, and analog test instruments. Test instrument 21 is a hardware device configured to send test signals, such as alternating current (AC) signals, direct current (DC) signals, and/or RF signals over transmission line 12 to DUT 14 for testing. The DUT may reply with, or transmit, response signals that are responsive to these test signals back over transmission line 12. Test instrument 21 expects the response signals to contain certain values and/or to have a certain timing, for example. If the response signals have the appropriate values and/or timing, the DUT may pass testing. If the response signals do not have those values and/or timing, then the DUT may fail testing.

The techniques described herein may be used to test the transmission line between the ATE and DUT or the connection between the transmission line and the DUT. Accordingly, in some implementations, the device being tested may be the transmission line only, a segment of the transmission line only, a connection between the transmission line and the DUT, or the entirety of the connection between the test system the DUT including the DUT and the transmission line. Example test conditions include when active components on the DUT are either powered down or disconnected from the transmission path between the test system and the DUT.

Test instrument 21 includes pin electronics 22, which may be part of test channel 11. Although only one instance of pin electronics 22 is shown in test instrument 21, test instrument 21 may include multiple—for examples, hundreds or thousands—of instances pin electronics 22, e.g., one instance of pin electronics for each test channel to a pin on DUT 14. Example pin electronics includes electronic circuitry that communicates with one or more pins on DUT 14 via transmission line 12. The electronic circuitry may be analog, but that is not a requirement. The pin electronics can deliver signals, power, voltages, and/or currents to a DUT pin, and can measure a DUT's response, including electrical characteristics of the delivered signals, power, voltages, and/or currents.

Pin electronics 22 may be configured—for example, programmed and/or controlled—to function as a detector circuit or as part of a detector circuit by performing TDR and crosstalk testing over transmission line 12 using the techniques described herein. As noted previously, one example type of TDR testing includes outputting an electrical signal containing an incident edge onto a transmission line, measuring the incident edge and a reflection of the incident edge on the transmission line, and determining a signal path length or other transmission line attribute(s) based on a difference between the two measurements.

In this example, pin electronics 22 includes a driver circuit 24 and a receiver circuit 25. Driver circuit 24 includes any electronic device, such as a voltage and/or current output device, configured to output electrical signals, such as signal edges or pulses onto transmission line 12 through resistor 19. Receiver circuit 25 is configured to receive a signal, such as an incident electrical signal, a reflected electrical signal, or a combination of incident and reflected signals from transmission line 12 via branch 26. Branch 26 of transmission line 12 includes no impedance-producing elements in this example. As a result, signal reflections, or at least the majority thereof, pass to receiver circuit 25, rather than back into driver circuit 24. Receiver circuit 25 may implement a detector that includes a comparator to compare incident and reflected edges to a threshold 27 to detect information about the incident and/or reflected waveform, e.g., to identify edges thereof. The timings of the incident and reflected edges may be processed by the test instrument or control system (described below) to identify a location of the reflection and, thus, one or more attributes of transmission line 12.

In a particular non-limiting example of an instance of pin electrics 22, a driver has a 50Ω output impedance resistor 19 and a detector for each channel has two programmable thresholds. In an example, only one threshold is used for the TDR application, although both may be used for TDR testing in some examples. These elements can be configured to provide TDR testing. In this example, each channel in the pin electronics has two modes of operation. These modes include a high-voltage mode and a high-speed mode. The high-voltage mode uses less system power and allows the pin electronics to operate between −2V and +6V. The high-voltage mode allows 50 Mbps (megabits-per-second) operation and operates at a low enough power to support 32 channels in a PXIe backplane with adequate user current. The high-speed mode requires more power but allows 400 Mbps operation for voltages between 0V and 4V from the pin electronics. The pin electronics outputs a much faster rise time in order to achieve the 400 Mbps data rate at the expense of power. This faster rise time can be used to create an effective TDR edge.

In some implementations, pin electronics 22 includes programmable logic or other programmable circuitry such as FPGA 29. In some implementations, there may be one FPGA per instance of pin electronics. In some implementations, a single FPGA may service multiple instances of pin electronics. In some implementations, other programmable circuitry may be used instead of, or in addition to, FPGA 29, such as a programmable logic device (CPLD) or a programmable logic array.

FPGA 29 is programmable to set threshold 27 for receiver circuit 25 that is used to compare incident and reflected edges to the threshold to identify those edges. For example, a test program may be loaded into test instrument 21 as described below. The test program may contain thresholds that are to be programmed into the FPGA to enable the example TDR testing and/or crosstalk detection described herein. Firmware may be programmed into the FPGA to perform specific test operations. For example an application—which is another term for FPGA firmware—may be programmed into the FPGA to perform ATE functionality and another application may be programmed into the FPGA to enable the FPGA and corresponding memory to capture TDR data as part of transmission line TDR analyses.

FPGA 29 also includes hardware delay elements 30, which are hardware circuits such as time delay relays configured to add time delay into a circuit path. Each hardware delay element is configured—for example, designed, manufactured, and/or controllable—to provide a predefined amount delay. For example, each hardware delay element may provide the same amount of delay. In an example, each hardware delay element may provide a delay of 1/16 nanoseconds (ns) or more or less, such as 1/64 ns, 1/32 ns, 1/8 ns, 1/4 ns, 1/2 ns, and so forth. The examples described herein use delay elements that each introduces a time delay of 1/16 ns into a circuit path; however, time delay elements that introduce more or less time delay may be used in some examples.

FPGA 29 may include non-transitory machine-readable memory 33 for storing the data captured using the processes described herein and for storing the waveforms reconstructed using the processes described herein. In some implementations, memory 33 may be located on the test instrument and not in the FPGA or at some other location in the test system. In some implementations, memory 30 may be distributed across multiple locations, such as FPGA 22, test instrument 21 (outside of FGPA 22), and test system 20 (outside of test instrument 21 and thus also outside of FPGA 22).

In the example of FIG. 1, transmission line 12 is open-ended. In this example, open-ended means that relay 17 is closed, that connector 20 connects second microstrip 16 to transmission line 12 (in this example, a coaxial cable), but that the end 32 of transmission line 12 is not connected to DUT 14 or to any other circuit. In other examples, open-ended may have a different configuration than that shown in FIG. 1. TDR testing in the open-ended configuration is described with respect to FIG. 2. During TDR testing, DUT 14 is powered off.

Figure 2:
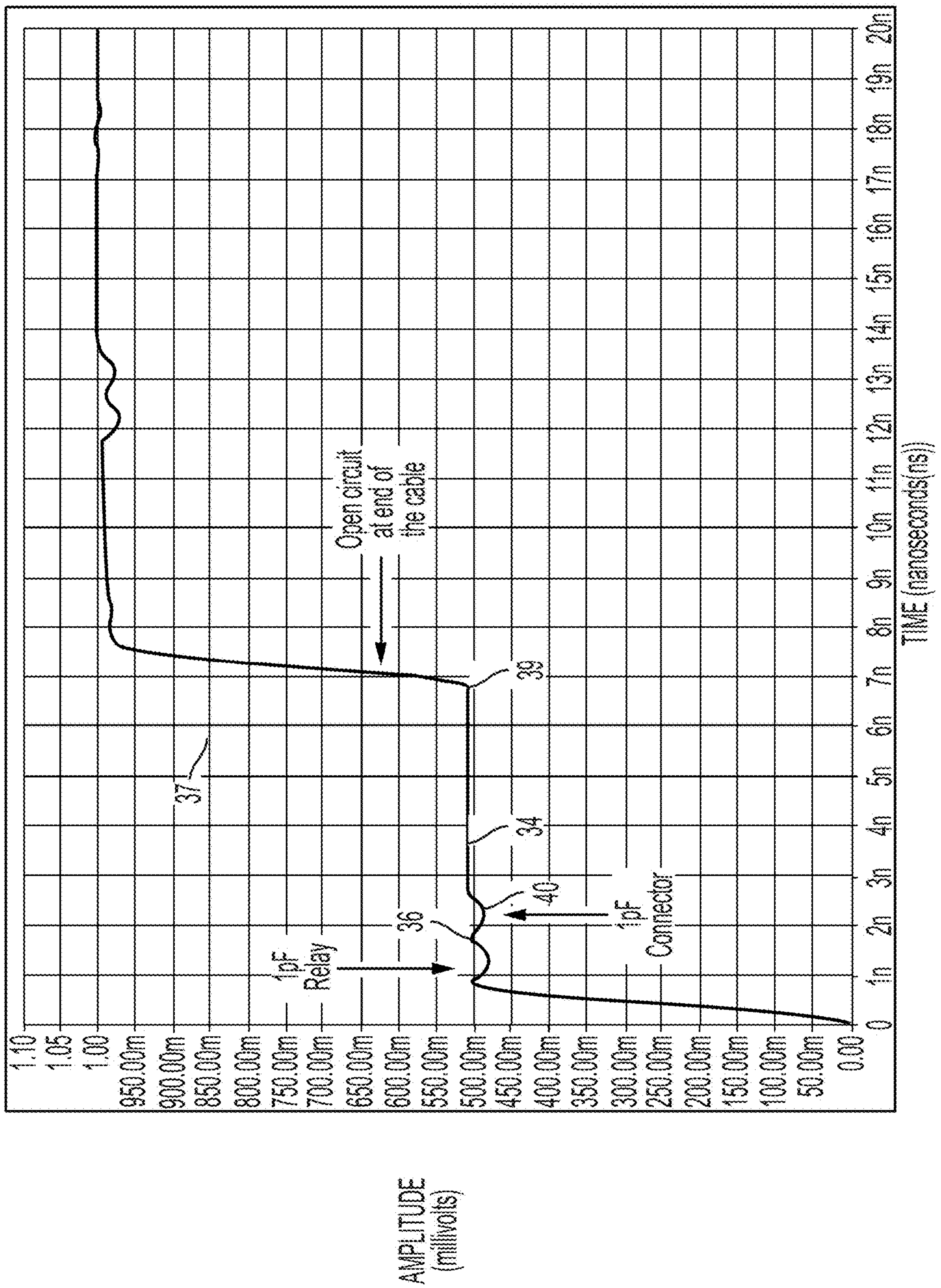
FIG. 2 is a graph showing an example waveform detected from the transmission line in the configuration of FIG. 1.

Refer also to FIG. 2, which show a waveform 37 representing signal reflections over the transmission line in terms of amplitude (voltage in millivolts (mV)) versus time. In an open-ended configuration, driver circuit 24 outputs an electrical signal onto transmission line 12 through its output impedance, namely resistor 19. During an initial output, receiver circuit 25 initially detects an incident edge voltage 34 that has been divided by resistor 19, with part of the electrical signal passing through branch 26 and part of the electrical signal passing through a remainder 35 of test channel 11. As shown in FIG. 2, signal reflections at relay 17 and connector 20 caused by slight impedance mismatches at those locations that show-up as ripples 36 in the waveform 37 of FIG. 2. At time 39, receiver circuit 25 begins to detect the portion of the electrical signal reflecting from open end 32 of transmission line 12. The reflection occurs because transmission line 12 is open ended and the electrical signal has nowhere else to go, essentially. The reflection from the open end 32 augments incident edge waveform to thereby increase the voltage at receiver circuit 25. Since receiver circuit 25 sees the reflection of the signal, the time from the incident edge voltage to the open end detected is twice the actual delay to the open end. In the example of FIG. 2, the time 39 that the open circuit happens is just under 7 ns after the incident edge of the signal and about 5 ns after the location 40 of connector 20. This behavior implies that the actual propagation delay is actually about 2.5 ns through transmission line 12 before there is an open circuit. It also implies that the propagation from driver circuit 24 to connector 20 is approximately 1 ns.

Figure 3:
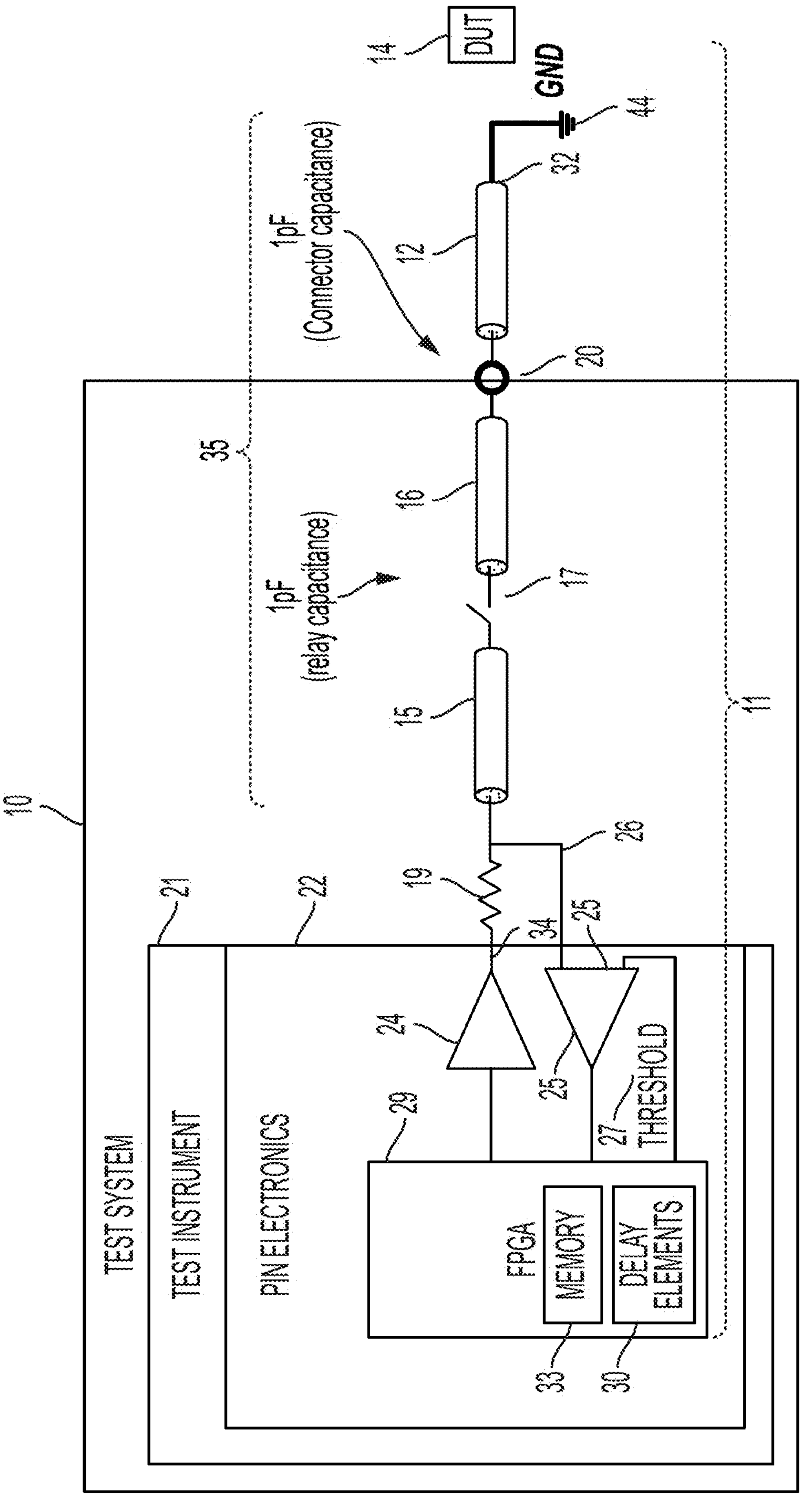
FIG. 3 is a block diagram showing an example test channel of a test system including a transmission line having short-circuited end.

Referring to FIG. 3, in this example, transmission line is short-circuited, for example electrically connected to electrical ground (GND) 44 without connection to DUT 14. In this example, short-circuited means that relay 17 is closed, that connector 20 connects second microstrip 16 to transmission line 12, but that the end 12 of transmission line 12 is connected to ground 44. In other examples, short-circuited transmission lines have a different configuration than that shown in FIG. 3. TDR testing in the short-circuited configuration is described with respect to FIG. 4. During TDR testing, the DUT is powered off.

Figure 4:
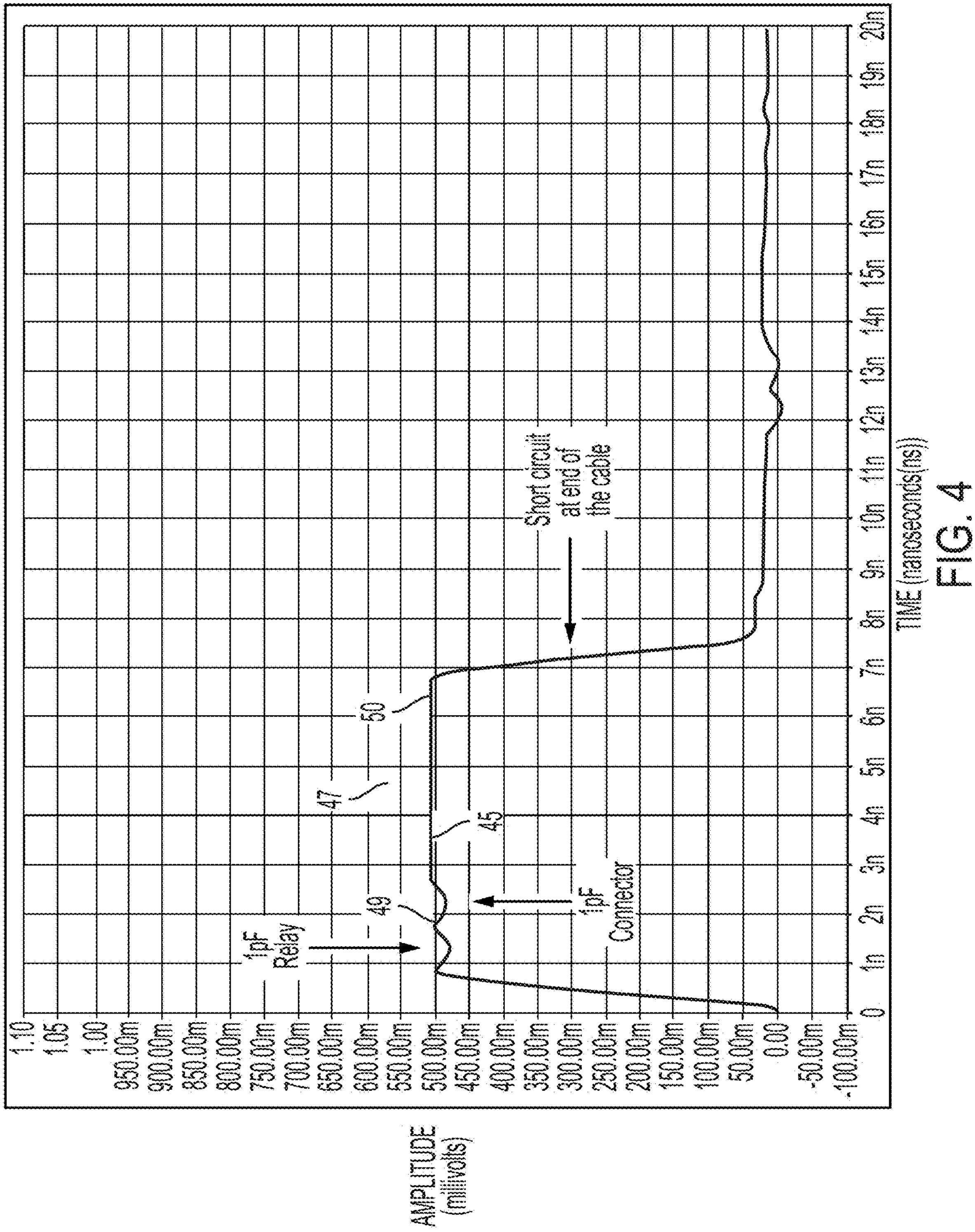
FIG. 4 is a graph showing an example waveform detected from the transmission line in the configuration of FIG. 3.

Refer also to FIG. 4, which show a waveform 46 representing signal reflections over the transmission line in terms of amplitude (in millivolts) versus time. In a short-circuited configuration, driver circuit 24 outputs an electrical signal onto transmission line through resistor 19. During an initial output, receiver circuit 25 initially detects an incident edge voltage 45 that has been divided by resistor 19, with part of the electrical signal passing through branch 26 and part of the electrical signal passing through a remainder 35 of the test channel. As shown in FIG. 4, signal reflections at relay 17 and connector 20 caused by slight impedance mismatches at those locations show-up as ripples 49 in waveform 47. At about time 50, receiver circuit 25 detects that end 32 of transmission line 12 is short-circuited. As a result, the voltage at receiver circuit 25 drops to about zero, since there are no reflections and all current from driver circuit 24 passes to ground. The amplitude waveform in units of voltage can be converted to impedance using the source signal and the reflected signal.

Figure 5:
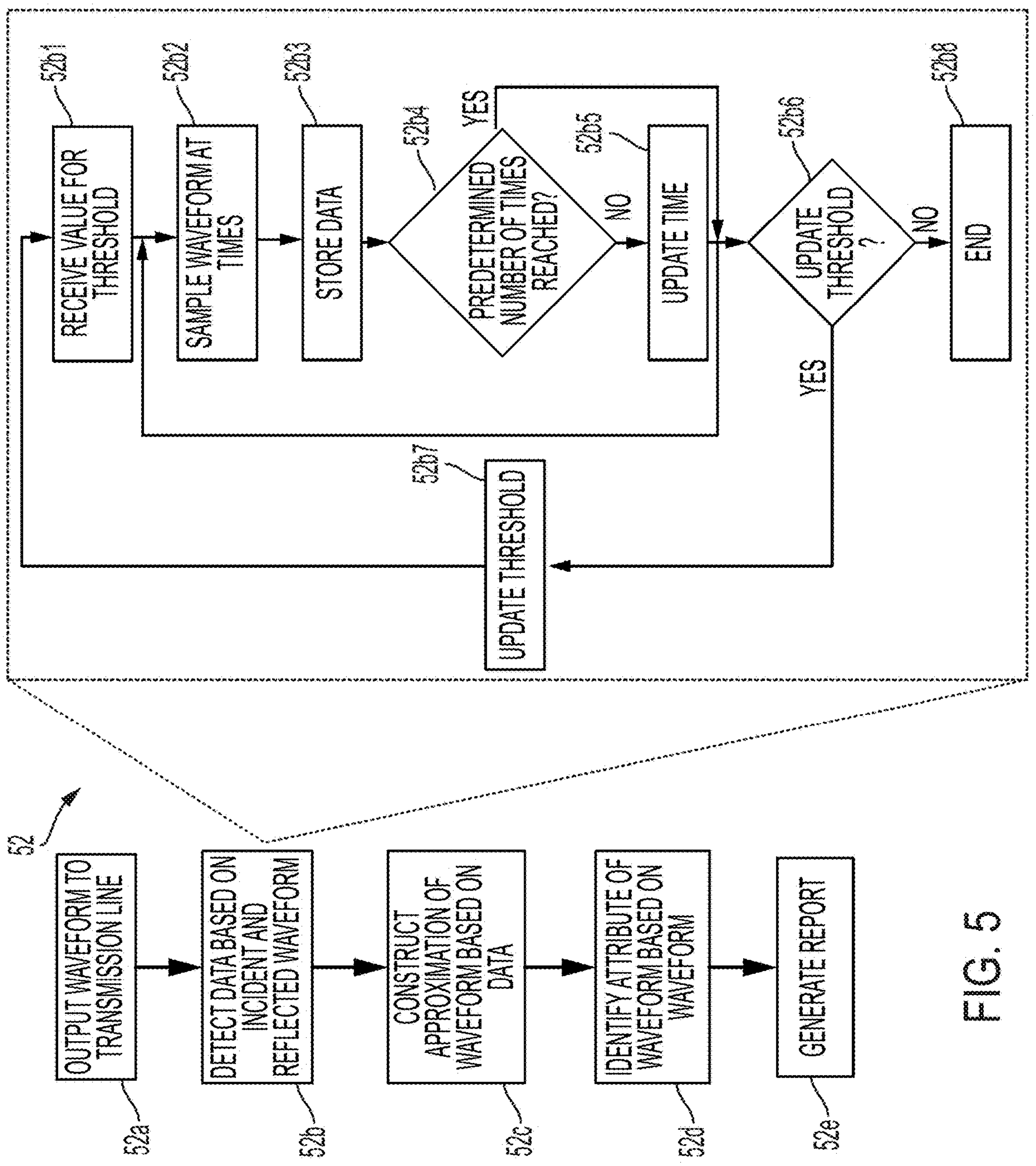
FIG. 5 is a flowchart showing example operations included in an example process for performing time domain reflectometry (TDR) testing.

FIG. 5 shows example operations included in an example process for performing TDR testing to detect attributes of a transmission line, such as a change in impedance in the transmission line, one or more impedances on the transmission line, an electrical length of the transmission line or a segment of the transmission line, or the open or short circuits described with respect to FIGS. 1 to 4.

Detecting open circuits may include determining the electrical distance (in units of time) from connector 20 on test system 10 to an end 32 of the transmission line 12 that has an open circuit. This open circuit may happen at the end of the transmission line or at some point along the transmission line. A user may program, into test system 10, test limits or thresholds to determine if the open circuit is an expected open. The test limits or thresholds can be used with a captured waveform generated based on the capture data or on an interpretation of the captured waveform. The ATE can interpret the captured waveform based on reflections to determine likely segments of the captured waveform containing impedance changes. These segments can then be individually tested against user-defined test limits.

Detecting short circuits may include determining the electrical distance (in units of time) from connector 20 on test system 10 to a short circuit in the transmission line, such as at end 32. The user may program, into test system 10, test limits or thresholds to determine if the short circuit is an expected short circuit.

Figure 6:
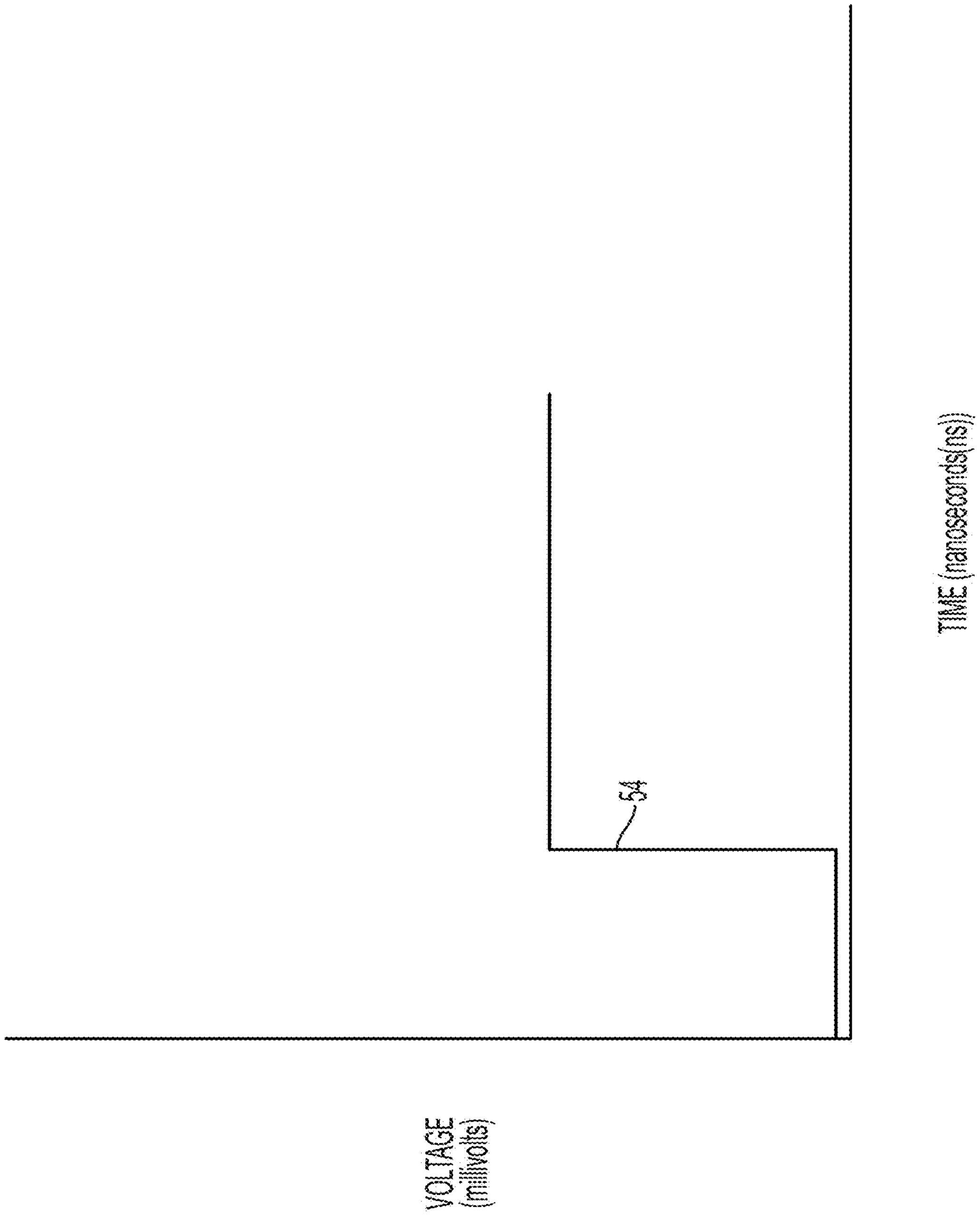
FIG. 6 is a graph showing an example signal edge that may be driven onto a transmission line during TDR testing on a transmission line.

Referring also to FIGS. 1, in some implementations, process 52 may be controlled by a control system such as that described below and implemented using pin electronics 22, FPGA 29, and/or other components of test system 10. Process 52 includes controlling driver circuit 24 to output (52*a*) a waveform onto transmission line 12. The waveform may be an electrical signal as described herein having an incident edge. The incident edge may be positive edge or a negative edge. FIG. 6 shows an example positive incident edge 54 that may be output by driver circuit 24.

Process 52 includes pin electronics 22 detecting (52*b*) data based on the incident and reflected waveforms. This operation may be implemented by receiver circuit 25 in pin electronics 22. The receiver circuit is configured to scan the waveform across a range of times and across a range of voltages to obtain the data for the waveform. The times and voltages used in the following description are examples only and are used to illustrate process 52. Different times and/or voltages may be used by process 52.

Examples operations for detecting (52*b*) the data includes receiving (52*b*1) a voltage threshold against which the receiver circuit 25 compares received data. As explained above, the threshold may be programmed into test system 10 by a user or test program; consequently, the threshold is software-based and can be set and reset to any value or values. The threshold may be, represent, or correspond to a voltage level, or increment thereof, against which data sampled from the transmission line 12 by receiver circuit 25 is compared. In an example, the threshold is 0.5 millivolts (mV).

Process 52 includes receiver circuit 25 detecting data from the transmission line by comparing the data to the threshold. The data that is detected is from the incident and/or reflected waveforms on transmission line 12, such as those shown in FIGS. 2 and 4. If a voltage of the data exceeds the threshold, the data is detected. If a voltage of the data does not exceed the threshold, the data is not detected.

FPGA 29 samples (52*b*2) detected data from receiver circuit 25—that is, the FPGA obtains the data from receiver circuit 25 that exceeds the voltage threshold. The FPGA performs sampling at specified times in a predefined range (e.g., 0 ns to 256 ns), with each time being separated by a time period. The time period at which the data is sampled by the FPGA may be inherent to the FPGA or programmed into the FPGA by a user or test program, and the times at which sampling occurs may be set and changed by delay elements 30 in the FPGA. By way of example, the time period that separates the times may be 1 ns, which may be clock resolution for FPGA 20. The delay elements, however, enable sampling at a higher resolution than the clock resolution. For example, during a first round of sampling, FPGA 29 may sample data from receiver circuit 25 at 0 ns, 1 ns, 2 ns, . . . up to 255 ns. During a second round of sampling on the same waveform, a single delay element may be introduced into the FPGA sampling circuit path, with causes the FPGA to perform sampling a 1/16 ns, $1^{1/6}$ ns, $2^{1/6}$ ns, . . . up to $255^{1/6}$ ns. During a third round of sampling on the same waveform, two delay elements, may be introduced, then three delay elements in a fourth round, then four delay elements in a fifth round, up to fifteen delay elements in a sixteenth round. Notably, the delay elements during sampling rounds need not be introduced in sequence. For example, a first round of sampling may introduce twelve delay elements, a second round of sampling may introduce no delay elements, a third round of sampling may introduce two delay elements, and so forth until (in this example) sixteen rounds of sampling covering different numbers of delay elements in each round are performed.

Returning to focus on the first round of sampling, in this example, FPGA 29 samples data from receiver circuit 25 at 0 ns, 1 ns, 2 ns, . . . up to 256 ns. FPGA 29 stores (**52*b*3) the sampled data in memory 33** in association with the time at which each instance of sampled data (which may contain one or more bits of data) was sampled.

Process 52 determines (**52*b*4) if a predetermined number of times has been reached for the present, same voltage threshold for the same waveform. The predetermined number of times may be based on the time range that the data is sampled over, the FPGA clock resolution, and the resolution of the delay elements. In the example presented herein, the data is sampled over 256 ns, the clock resolution is 1 ns, and the delay element resolution is 1/16 ns. So, in this example the predetermined number of times may be 16 samples for each of 256 ns, or 4096 samples. If 4096 samples have been collected, then the condition of operation 52*b*4** is satisfied.

In an alternative formulation, the predetermined number of times in operation **52*b*4 may be based on the number of delay elements introduced into the FPGA sampling circuit path for the present, same voltage threshold for the same waveform. For example, if all expected delay elements have been introduced into the FPGA sampling circuit path, then the condition of operation 52*b*4** is satisfied.

In any case, if the condition of operation **52*b*4 has not been satisfied, process 52 updates (52*b*5) the time at which the same voltage waveform is sampled at the present, same voltage threshold. As explained previously, this may be done by adding or removing delay elements 30 from the sampling circuit path of FPGA 29. For ease of explanation, this example assumes initial sampling at the 1 ns clock resolution and that an additional delay element, having a delay of 1/16 ns, is introduced into the FPGA circuit path. Accordingly, in this example, updating the time causes FPGA 29 to perform sampling a 1/16 ns, $1^{1/6}$ ns, $2^{1/6}$ ns, . . . up to $255^{1/6}$ ns for the present, same voltage threshold and the same waveform. Operations 52*b*2 through 52*b*5 may be repeated to cause FPGA 29 to perform sampling at 2/16 ns, $1^{2/6}$ ns, $2^{2/6}$ ns, . . . up to $255^{2/6}$ ns for the present, same voltage threshold and the same waveform, to cause FPGA 29 to perform sampling at 3/16 ns, $1^{3/6}$ ns, $2^{3/6}$ ns, . . . up to $255^{3/6}$ ns for the present, same voltage threshold and the same waveform, to cause FPGA 29 to perform sampling at 4/16 ns, $14^{1/6}$ ns, $2^{4/6}$ ns, . . . up to $255^{4/6}$ ns for the present, same voltage threshold and the same waveform . . . and so forth up FPGA 29 performing sampling at 15/16 ns, $1^{15/6}$ ns, $2^{15/6}$ ns, . . . up to $255^{15/6}$ ns for the present, same voltage threshold and the same waveform. In this example, "to $255^{15/6}$ ns" represents a number of delays summed to reach the time period (256 ns) minus a single delay (1/16 ns). Thereafter, the condition at operation 52*b*4 is satisfied. In this example satisfying operation 52*b*4** means that all samples have been collected for the present, same voltage threshold and the same waveform. In some examples, the "same waveform" for subsequent samples may be a different instance of the waveform output for the first sample that is identical or substantially identical to the waveform output for the first sample. For example, the "same waveform" may include different instances of a waveform having the same shape, magnitude timing, and/or other characteristics output to the transmission line repeatedly.

Thereafter, process 52 process to operation **52*b*6, where it is determined whether to update the threshold 27. Determining whether the threshold is to be updated may include comparing a present threshold to a predefined maximum threshold. If the present threshold is less than the predefined maximum threshold, then the threshold is to be updated (52*b*7). If the present threshold is greater than the predefined maximum threshold, the threshold may not need to be updated. For example, each update to the threshold may include incrementing the threshold by 0.5 mV. In this example, the predefined maximum threshold may be 128 mV, which corresponds to 256 updates. If the present threshold is less than 128 mV, then the threshold is updated. Updating the threshold may include adding the threshold (in this example, 0.5 mV) to a present aggregated value for the threshold. If the present value for the threshold is 0.5 mV, updating the value for the threshold results in a threshold value of 1 mV; If the present value for the threshold is 1 mV, updating the value for the threshold results in a threshold value of 1.5 mV; if the present value for the threshold is 1.5 mV, updating the value for the threshold results in a threshold value of 2.0 mV . . . up to the predefined maximum value for the threshold of 128 mV. In some implementations, updating may not be sequential; rather, the 0.5 mV increments of the threshold may be processed in any appropriate order. For example, a first update may produce a threshold of 6.5 mV; a second update may produce a threshold of 2.5 mV; a third update may produced a threshold of 100.5 mV; and so forth so long as all possible 0.5 mV increments from 0 to 128 mV are accounted for. In any event, operations 52*b*1 through 52*b*7 are repeated a predetermined number of times, each time using an updated (52*b*7**) value for the threshold. In some implementations, the values of the threshold extend at least from a lowest voltage value of the waveform to a highest voltage value of the waveform. This range of thresholds ensures that all features of the waveform will be captured during scanning of the waveform across the range of voltages and times. A number of values of the threshold is typically less than or less than or equal to, a number of values for the time; however, in some implementations, a number of values of the threshold may be greater than or greater than or equal to a number of values for the times. The threshold may also extend into negative values in some examples.

In some implementations, the threshold sweep—for example, the processing from the minimum voltage threshold to the maximum voltage threshold—should at least cover a driver swing—for example, the range of voltages on a signal sent by the driver. For example, if the driver is sending a TDR edge from 0V to 1V, then the detector sweep should at least encompass those numbers for an example sweep from—e.g., from 0.25V to 1.25V in order capture the entire waveform during TDR testing. So, in this example, the range of thresholds exceeds the driver sweep.

In an example, assume a 0.5 mV increment, resulting in a first new threshold value of 1.0 mV. In this case, operations **52*b*1 to 52*b*7** are repeated until the 128 mV threshold value is reached and processed. By changing—for example, increasing the threshold progressively incrementally—the full range of voltages (for example, 0.5 mV to 128 mV) of the incident and reflected waveforms on the transmission line may be sampled. And, as noted above, for each threshold, the samples may be across the predefined range of times (for example, 0 ns to 256 ns). In this example, this results in 4096 samples for each of the 256 thresholds. This information defines the shape of the TDR waveform on the transmission line. As noted, in other examples, the range of voltages and the range of times may be different—for example, greater, less, different resolutions, and so forth—than the examples presented herein for illustration.

Referring back to FIG. 5, if the maximum value of the threshold is reached (**52*b*6), the operation 52*b* ends (52*b*8**).

Figure 7:
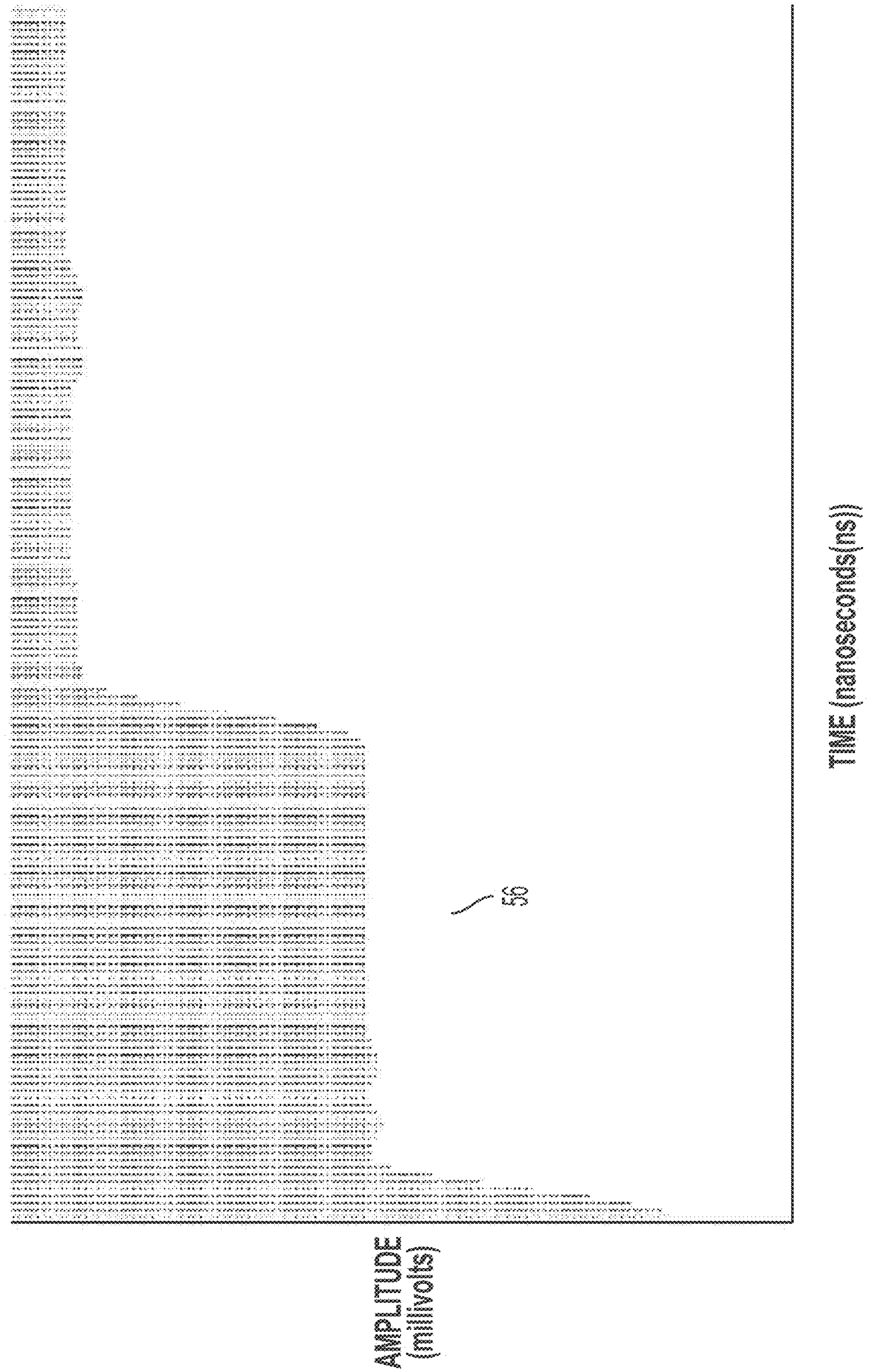
FIG. 7 is a graph showing an example constructed approximation of the waveform shown in FIG. 2 obtained using the example process of FIG. 5.

In this example, the data collected by operations **52*b*1 to 52*b*7 from the incident and reflected waveforms of FIG. 2 is retrieved from memory 33, such as a random access memory (RAM), and processed to construct (52*c*) an approximation of the waveform of FIG. 2. For example, FPGA 29 or one or more processing devices elsewhere on test instrument or test system may process the data to construct the approximation the approximation of the waveform of FIG. 2. In an example, a two-by-two array is created using the combined data from the time and voltage sweeps. The array is used to recreate an approximation of the waveform of FIG. 2. To illustrate the technique, a table may be exported into Microsoft® Excel® with the vertical axis incrementing the threshold by 0.5 mV and the horizontal axis incrementing time by 1/16 ns. For each cell, if the measured voltage was greater than the threshold, a "1" is printed, otherwise a null is printed. An example 56 of a reconstruction of waveform 37 created using this technique is shown in FIG. 7. Similar processing may be used to construct waveform 47 of FIG. 4. Note that Microsoft® Excel® may not be used during automated testing to produce reconstructed waveforms such as that shown in FIG. 7**.

Process 52 analyzes the constructed approximation (FIG. 7) of the waveform to identify (**52*d*) one or more attributes of transmission line 12 such as, but not limited to, a change in impedance in the transmission, one or more impedances on the transmission line, an electrical length of the transmission line, and where on the transmission line one, more, or all of these are located. Since each instance of pin electronics 22 associated with a transmission line may be used in performing the processing of operations 52*b*1 to 52*b*7 in parallel, attributes of multiple transmission lines may be determined at the same time or at about the same time—for example, concurrently, simultaneously, or contemporaneously. In some implementations, the transmission lines may be tested consecutively, one after the other, rather than in parallel. Ranges of values and tolerances therefor may be set to identify (52*d*) the one or more attributes of transmission line 12**. These ranges and tolerances therefor may be programmed by a user into the test system, e.g., into a test program run on the test system.

The length of time used for capture may be proportional to the maximum transmission line propagation delay supported. The time is a suggested starting point to support reasonable length transmission lines. In an example, the minimum pulse width—for example, waveform output onto the transmission line—may be at least 200 ns for a period of 400 ns to allow for multiple reflections to settle before driving low for a next sample. In an example, for TDR mode, the driver edge is a 1V swing from 0V to 1V. In this example, the detector threshold is initially set to −0.5V. In this example, for every instance of t, the state of the detector is stored where a 0x1 indicates the observed level is greater than the detect threshold, and a 0x0 indicates that the observed level is less than the detect threshold. In this example, once this is done for all instances of t from t=0 to t=50 ns, the detector threshold may be incremented by 10 mV. In this example, the time sweep is then performed for this new threshold and the detector states are captured by the FPGA as described. In this example, the process continues increasing the detector 10 mV until the detector threshold is 2.05V. This voltage sweep provides 256 steps or 8 bits of vertical data. A two by two array is created using the combined data from the time and voltage sweeps. In this example, the array is used to construct (**52*c***) an approximation of the waveform using the data for the waveform.

Process 52 may generate (**52*e*) a report containing the attributes. The report may be textual and/or graphical and may include an analysis of each transmission line that was tested and/or each segment of the transmission line that was tested. For example, the report may identify connectors in the transmission lines, where those connectors are located, changes in impedance in the transmission line, where those changes are located, one or more impedances on the transmission line, where those impedances are located, an electrical length of the transmission line, whether there are intermittent faults in the transmission line, where those intermittent faults are located, lengths of the transmission line or segments thereof, or any other information that can be identified or determined using the data captured by process 52**.

Figure 12:
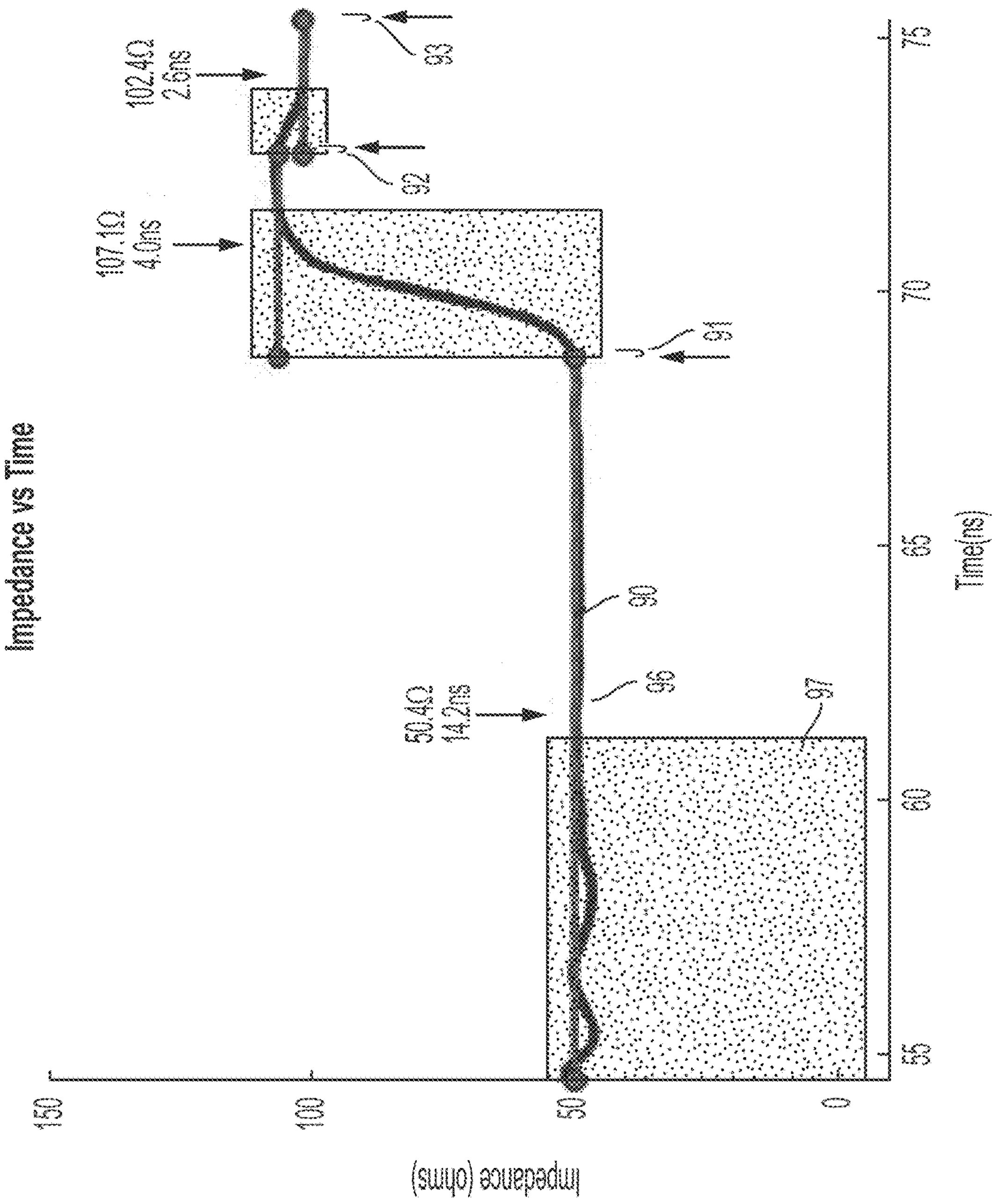
FIG. 12 is an example plot of impedance versus time for an example transmission line obtained using the example process of FIG. 5.

FIG. 12 shows an example of a report that may be generated (**52*e*) by process 52. In this example, FIG. 12 shows a portion of a voltage waveform for a transmission line captured using the pin electronics 22 described herein that has been converted to impedance plotted against time. The portion of the waveform preceding the displayed waveform 90 may include information about the transmission line associated with the ATE. The displayed waveform 90 includes the parts of the transmission line associated with a DUT. The J indicators 91, 92, 93 identify locations of impedance changes most likely due to a connector or some other type of transmission line junction. These locations may be determined by the FPGA, test instrument, or test system b comparing the measured impedances to predefined expected impedances associated with a connector or transmission line junction. The information in the report of FIG. 12 also includes lengths in nanoseconds of points (e.g., 96) of the transmission line and the impedance at that length. Transitions are identified using boxes such as box 97**. The settling time due to the change in impedance are marked in the rectangular boxes.

Figure 13:
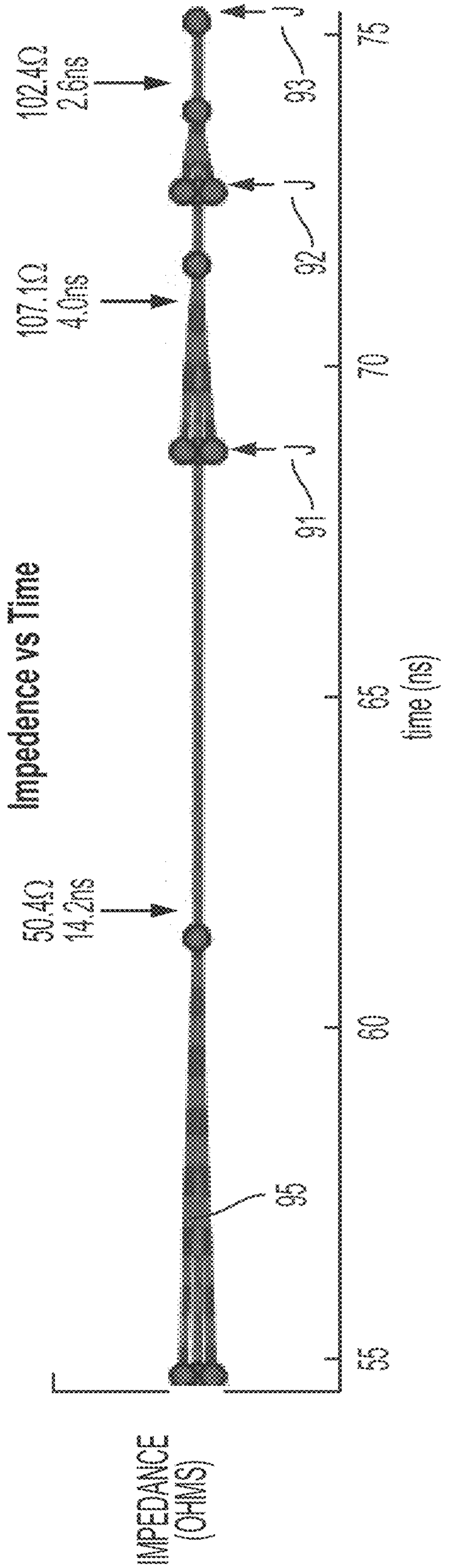
FIG. 13 is an example plot of impedance versus time for an example transmission line obtained using the example process of FIG. 5.

FIG. 13 shows an example of a report that may be generated (**52*e*) by process 52. In this example, FIG. 13 shows a simplified view of FIG. 12 where impedance is plotted against time for a transmission line, in which the converging line segments 95 simply show settling of the waveform. Segments may be combined with increased tolerances to simplify the network and associated test limits. Additional information about the transmission line may be include such as an indication that the transmission line ends in an open or short at the last J 93**.

In some implementations, test system 10 may set ranges or acceptable tolerances for any type of attribute of the transmission line. The attributes determined based on the data captured by process 52 may be compared to those ranges or acceptable tolerances and test system may determine whether the transmission line passed or failed testing. For example, if an impedance in the transmission line is outside of an acceptable range, then the transmission line may fail testing.

By way of example, hard transmission line faults may be identified by looking for measured transmission line attributes. For example, a transmission line may be broken into smaller segments. Process 52 may identify the locations of the segments by analyzing the measured waveforms such as that shown in FIG. 7, 12, or 13, e.g., by detecting changes in impedance on the transmission line. Process 52 may determine whether the changes in impedance represent faults by determining whether the impedance in each segment meets or exceeds an acceptable tolerance. For example if a transmission line has a 3 ns 50Ω transmission line segment in series with a 10 ns 75Ω transmission line segment, a user may be able to set independent tolerances for each segment. For example, the user may be able to program those tolerances into the test system prior to testing or include the tolerances in a test program. The test system may also use a similar method to learn attributes of one channel on a transmission line network and apply those attributes to other channels on the transmission line network. In this example, the user may incorporate the following tolerances into the test system: 3 ns+/−300 ps and 50Ω+/−2Ω for the first segment and 10 ns+/−2 ns and 75Ω+/−10Ω for the second segment. Process 52 analyzes data, such as that shown in FIG. 7, for each segment of the transmission line and determines whether the transmission line complies with all tolerances based on the tolerances for each segment thereof. If the transmission line segments comply with all tolerances, then the transmission line may be considered to pass testing; if not, then the transmission line may be considered to fail testing. Individual segments may also be identified as passing or failing.

Figure 14:
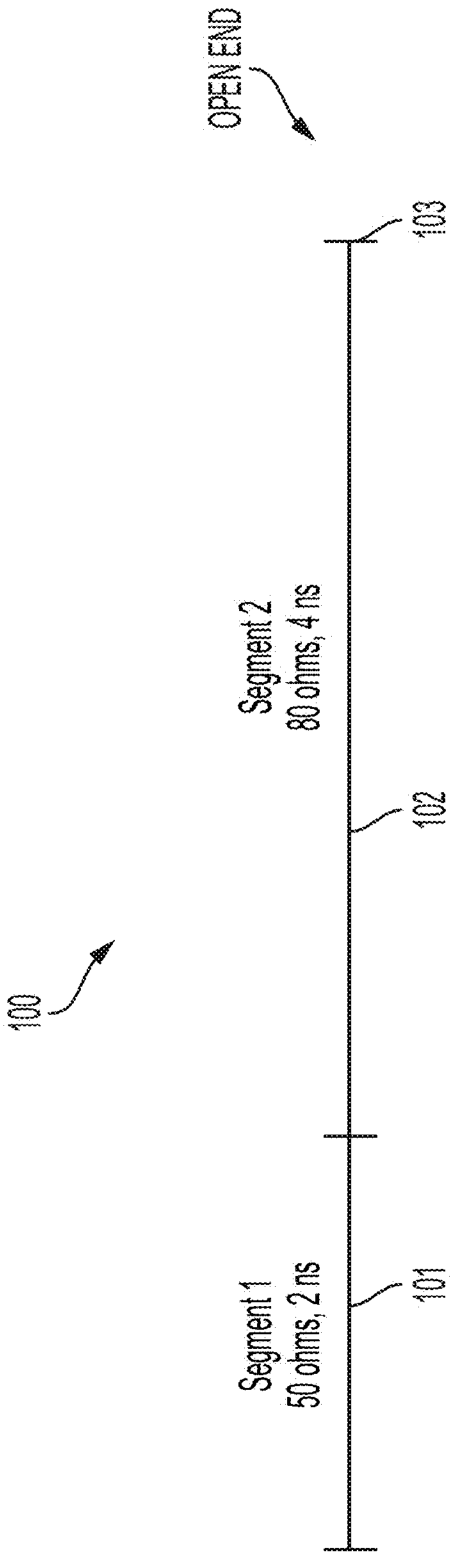
FIG. 14 is a block diagram of a transmission line having two segments and an open end.

FIG. 14 shows an example of a transmission line 100 having a first segment (1) 101, a second segment (2) 102, and an open end 103. First segment 101 and second segment 102 may be electrically connected by a connector (not shown). In an example, process 52 may test each segment 101, 102 against test parameters to determine whether each segment passed for failed testing. In an example, the test parameters may include a minimum impedance (Z), a maximum Z, a minimum electrical length (eLen), and a maximum eLen. These example parameters are different for each segment and for the open end, as shown in the following table.

TABLE

| | Min Z (Ohms) | Max Z (Ohms) | Min eLen (ns) | Max eLen (ns) |
|---|---|---|---|---|
| Segment 1 | 48 | 52 | 1.6 | 2.4 |
| Segment 2 | 60 | 100 | 2 | 6 |
| Open | 300 | No Limit | No limit | No Limit |

eLen = electrical length

The data obtained by process 52 for each segment and for the open end, including the approximation of the transmitted waveform(s) constructed at operation 52*c*, may be compared against the example minimum and maximum impedances and the example minimum and maximum electrical lengths from the table. If the determined attributes for segment 101 fall within the minimum and maximum impedances and the minimum and maximum electrical lengths from the table, then segment 101 may pass testing; otherwise segment 101 may fail testing. If the determined attributes for segment 102 fall within the minimum and maximum impedances and the minimum and maximum electrical lengths from the table, then segment 102 may pass testing; otherwise segment 102 may fail testing. If the determined attributes for open end 103 are greater than the minimum impedance, then open end 103 is identified as expected; otherwise, open end 103 is not identified as expected and testing may fail. If segments 101 and 102 and open end 103 are as expected, then the transmission line as whole may pass testing; otherwise, the transmission line as a whole may fail testing.

In a system with multiple channels, each channel can have a different transmission line network, each having different test limits. Automated testing allows quick testing over multiple channels such as these.

The parameters in the table above may be user defined. For example, they may be programmed manually into a test system by a user or may be part of a test program. The testing may be performed automatically by the test system for one or more transmission lines or may be performed manually for specific transmission lines. Automatically, in this context, may include the test system executing a test program to perform the operations used to perform the testing. Manual, in this context, may include a user providing the necessary instructions to control the pin electronics for specific transmission lines selected by the user. In some implementations, process 52 may perform testing on individual segments only, rather than on all segments of a transmission line. Which segments are tested may be determined manually or automatically, e.g., in a test program or by manual selection.

Intermittent faults may be difficult to detect. They occur intermittently and therefore may not be detected One way to check for intermittent faults is to examine the transmission line over time. The times over which the transmission line may be examined may be on the order of seconds, tens of seconds, minutes, hours or more-generally greater than the time it takes to perform process 52. By periodically, intermittently, or continually capturing the TDR data using process 52, comparisons can be made between different instances of the same captured waveform (e.g., waveform 56 of FIG. 7) to look for subtle changes over time. For example, comparisons may be made between attributes of the different instances of the same waveform, such as voltage magnitudes or timing of pulses other features of the different instances of the same waveform, at two or more different points in time. In this regard, since the transmission line is only excited by the driver circuit, the different instances of the same waveform on the transmission line should be virtually identical from capture to capture. If there are substantial differences between captures, this may indicate a potential intermittent fail point. For example, if there is wire or a connection that occasionally makes contact, the TDR waveform would show that the length of the cable is different from some runs to other runs. A more subtle situation may be that a 50Ω impedance at one point on the transmission line occasionally goes to 60Ω when run over a period of time. This change may imply a potential intermittent fault.

This information may be obtained based on the data captured by process 52 and included on the report (52*e*). The user can also specify tolerance limits on the intermittent faults to suit their needs.

In more detail, the intermittent faults may be detected by outputting different instances of the same waveform multiple times over the same transmission line. Circuitry, such as the pin electronics and the FPGA, detects data for each instance of the same waveform output on the same transmission line using the techniques described herein. One or more processing devices, which may be part of the control system, the test instrument, the FPGA, or the test system, compares the data captured for one instance of the waveform or information based thereon, such as waveform 56 of FIG. 7, to corresponding data captured for one or more other instances of the waveform or information based thereon. Differences in attributes, as described herein, may be identified. In some cases, the differences in attributes are deemed insignificant, whereas in other cases the differences in the attributes may be deemed significant enough to indicate an intermittent fault. The differences may be compared to thresholds to determine whether they are significant enough to indicate an intermittent fault. For example, an intermittent fault may be indicated if different instances of an attribute from different data captures for the different instances of the same waveform differ by 10%, 20%, 30%, 40%, 50%, or more or less. For example, if the threshold is 10% and the impedance at one point on the transmission line is 50Ω for one data capture for an instance of a waveform, and the impedance at the same point on the transmission line is 60Ω for another data capture for another instance of the same waveform, then the difference between the two data captures exceeds 10% and an intermittent fault may be identified. On the other hand, if the threshold is 10% and the impedance at one point on the transmission line is 50Ω for one data capture for an instance of a waveform, and the impedance at the same point on the transmission line is 53Ω for another data capture for another instance of the same waveform, then the difference between the two data captured is less 10% and an intermittent fault may not be identified. In some implementations, the threshold may be set by a user. For example, the user may program the threshold into the ATE. The threshold may be reset and/or changes for different transmission lines and different attributes.

Figure 16:
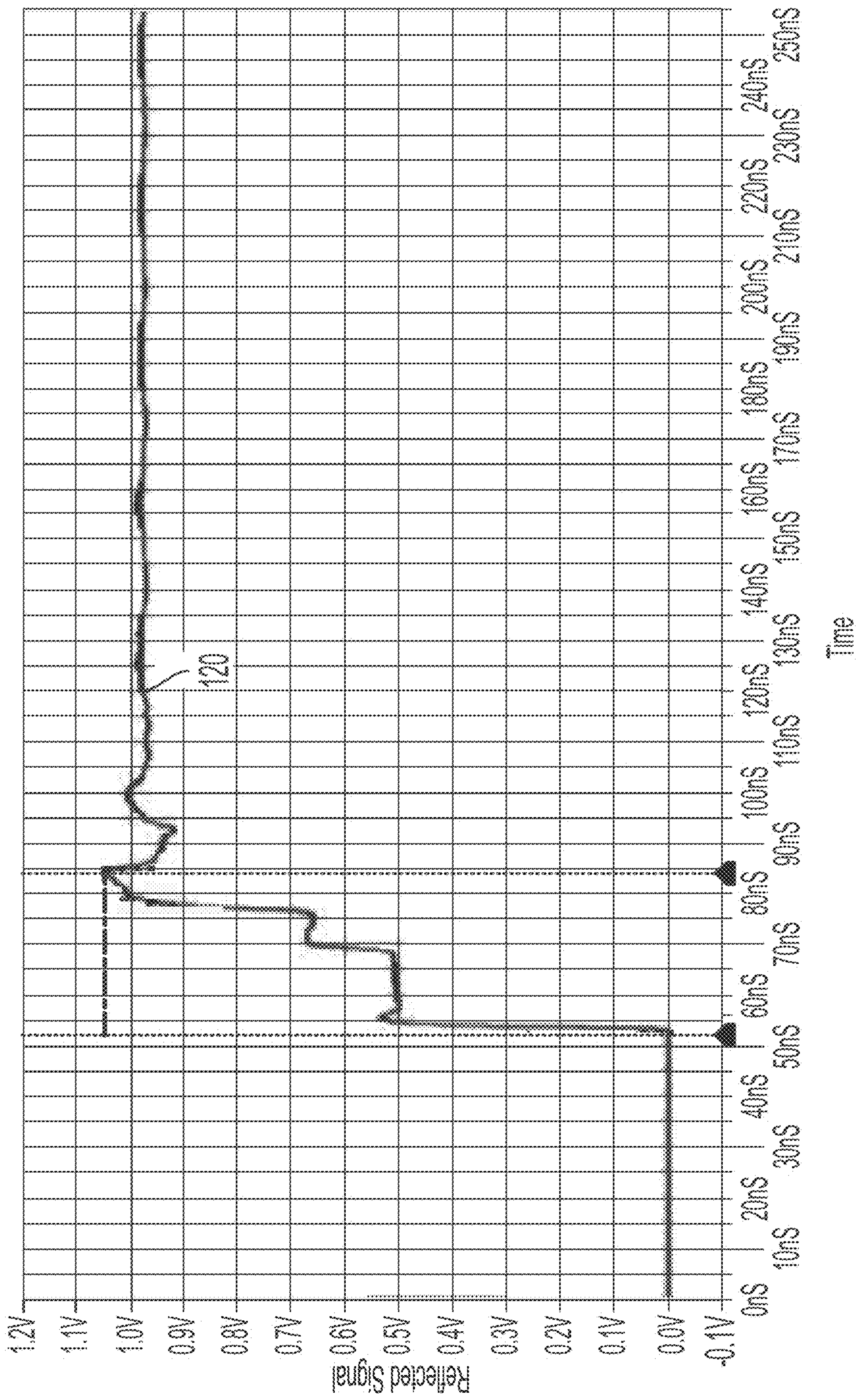
FIG. 16 is graph of an example TDR waveform.
Figure 17:
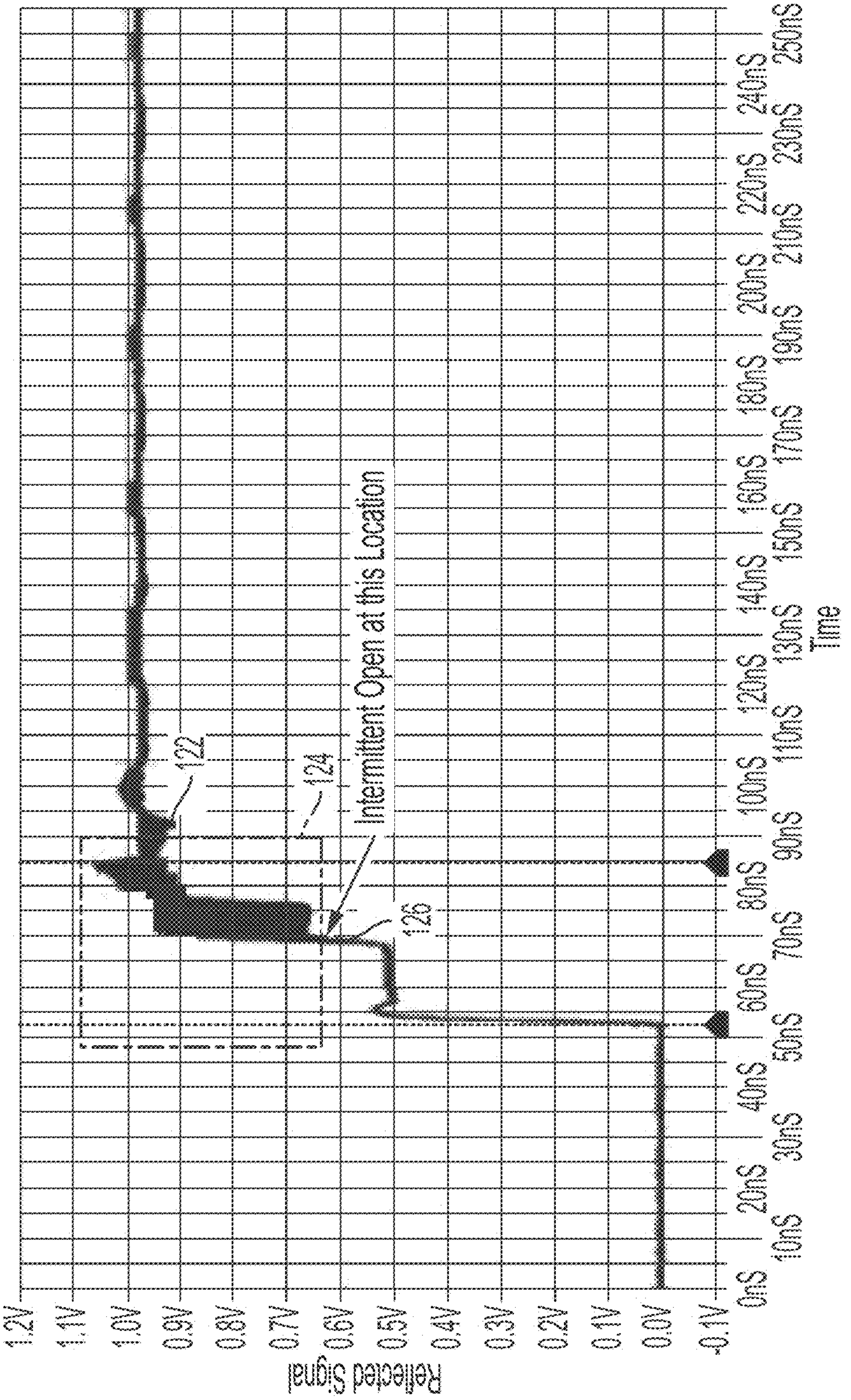
FIG. 17 is graph containing multiple example TDR waveforms.

Referring to FIG. 16, an example TDR waveform/reflected signal 120 is shown, which shows the voltage of the TDR waveform plotted against time. TDR waveform 120 may be generated and determined using process 52; that is, by outputting an electrical signal on a transmission line and capturing data based on reflection of that electrical signal on the transmission line. FIG. 17 shows transposition of multiple instances 122 of TDR waveform 120, which were produced by outputting multiple instances of the same electrical signal on the same transmission line, capturing data for each instance, generating a TDR waveform for each instance, and plotting the voltage of the TDR waveform for each instance against time. As shown in FIG. 17, in region 124, the TDR waveforms for the different instances of the same electrical signal begin to deviate. This indicates an intermittent fault, which in this instance indicates an open end of the waveform. The location 125 at which these TDR waveforms begin to deviate 126 is determined to be the location of the intermittent fault.

This foregoing description focuses on single-ended TDR data capture and analyses. The techniques described herein may be implemented using differential and single-ended signaling, so the same TDR capabilities used in the single-ended applications also apply in the differential applications. In this regard, differential signaling is a technique for electrically transmitting information using two complementary signals. The techniques described herein may send the same electrical signals described above as a differential pair of signals, each in its own conductor. When performing differential signaling, there may be some differences in the driver circuit and threshold voltages. In an example, each driver circuit may swing from 0V to 0.5V as complementary pairs to make a differential swing of +/−1V. The threshold voltage may be swept from −1.25V to 1.3V to maintain an 8-bit range. These values are examples for illustration only and may be the same or different from these presented in different configurations.

The TDR techniques described herein can be implemented on any combination of single-ended and/or differential channels concurrently, simultaneously, contemporaneously, or consecutively. A parametric measurement unit (PMU) (not shown) in test instrument 21 can perform simple DC characterization of the channels to look for possibilities of open or short circuits on a given channel without the TDR analysis simply by forcing a voltage or current and measuring the voltage or current. Multiple channels can, concurrently, simultaneously, contemporaneously, or consecutively, be excited to detect single or multiple faults in the channels.

Since the channels on the ATE can be configured for transmitting and/or receiving data, one channel can transmit waveforms while one or more other channels can configured for capturing data. Transmitting waveforms on one channel and detecting data on another channel can be used to identify crosstalk between two channels. This crosstalk can identify whether two channels are intentionally coupled together like a differential pair or whether they are inadvertently coupled together. Pass/fail criteria can be input to test system 10 by a user. The test system compares data representing the amount of crosstalk to the pass/fail criteria to determine whether the amount of crosstalk is within acceptable limits or whether reconfiguration of the system is needed to reduce the amount of crosstalk between two or more channels.

Figure 8:
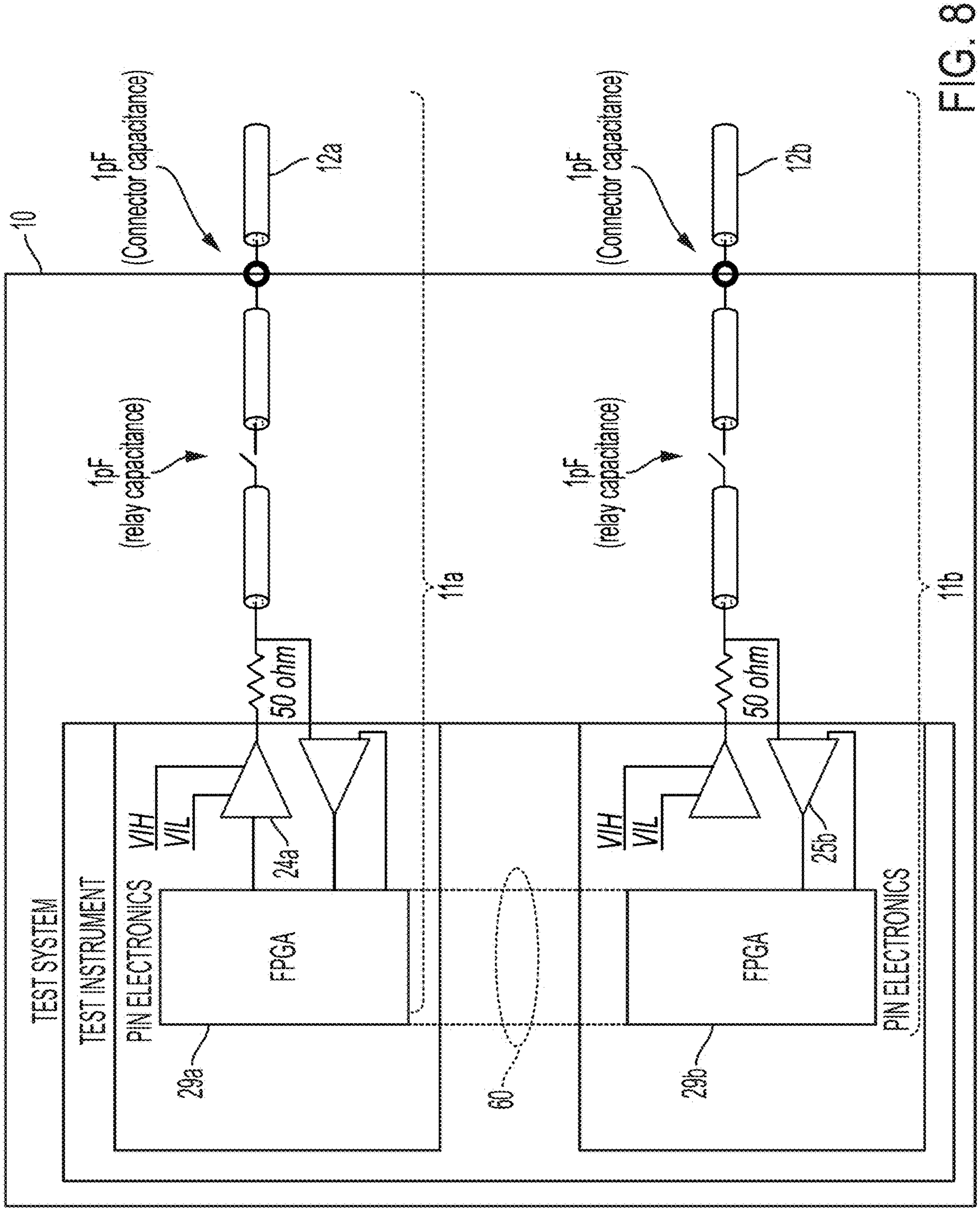
FIG. 8 is a block diagram showing two example test channels of a test system.

FIG. 8 shows two different channels 11*a* and 11*b*, each having an identical structure and function test channel 11 shown in FIGS. 1 and 3. Each channel 11*a*, 11*b* may be open-ended, short-circuited, and/or connected to a DUT (not shown). The channels 11*a*, 11*b* may have different terminations. Although only two channels 11*a*, 11*b* are shown, there may be hundreds or thousands of such channels in the system. The channels may be single-ended or differential. In addition, each channel may have its own FGPA 29*a*, 29*b* or the channels 11*a*, 11*b* may share an FPGA as represented by dashed lines 60. In some implementations different test channels may have different combinations of multiple transmitter and multiple receivers.

Figure 9:
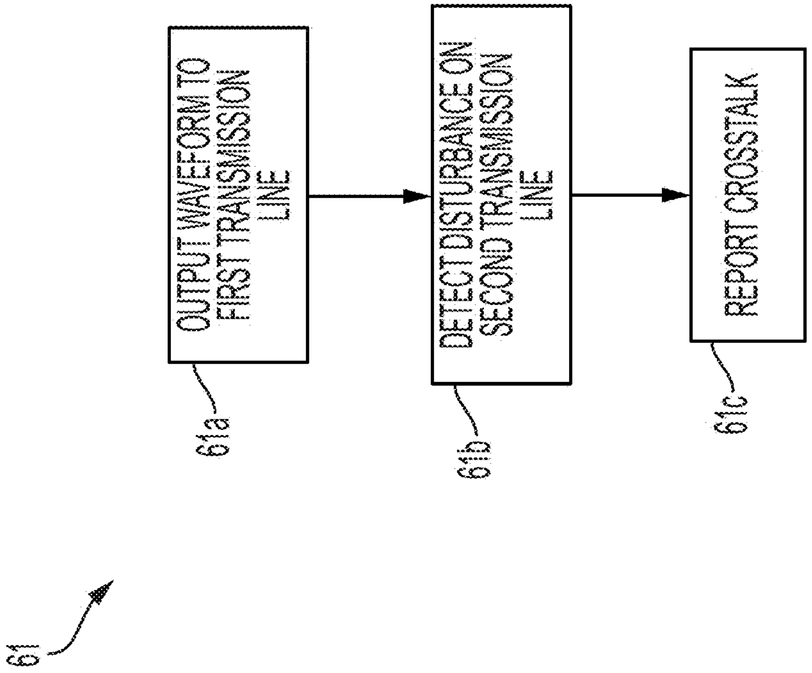
FIG. 9 is a flowchart showing example operations included in an example process for detecting crosstalk between two transmission lines.

Referring to FIG. 9, process 61 includes example operations for identifying crosstalk between channels 11*a* and 11*b*. In this example, no signal is driven to transmission line 12*b*. In this example, driver circuit 24*a* of channel 11*a* outputs/drives (61*a*) an electrical signal to transmission line 12*a*. The electrical signal may be of any type, including those described herein. Due to crosstalk between transmission lines 12*a* and 12*b*, the signal on transmission line 12*a* produces a signal, referred to as a disturbance, on transmission line 12*b*. Receiver circuit 25*b* on test channel 11*b* detects (61*b*) this signal/disturbance produced on transmission line 12*b*. FPGA 29*b* samples the data for this signal. FPGA 29*b* or one or more processing devices on test instrument or elsewhere in test system 10 analyze the sample data to determine the amount or level of the crosstalk. FPGA 29*b* or one or more processing devices on test the instrument or elsewhere in the test system compares this amount or level of crosstalk to a predefined range(s), value(s), and/or acceptable tolerance(s). The ranges, values, and/or tolerances may be set to identify the crosstalk. The ranges, values, and/or tolerances therefor may be programmed by a user into the test system, e.g., into a test program executed by the test system. The resulting comparison may indicate whether the amount or level of crosstalk is acceptable or not. In either case, process 61 generates and outputs a report (61*c*) identifying the amount or level or crosstalk and indicates whether the amount or level is acceptable.

When executing a crosstalk measurement, it may be better to change the resolution on the detector sweep since crosstalk usually is a much smaller percentage of the full driver swing. For example the TDR edge may be 1V, but the crosstalk to adjacent channels may only be 100 mV. The test system may be able to capture a more precise waveform if the full scale measurement on the channel receiving the crosstalk was closer to 100 mV (e.g., 125 mV or so). This can be done as a two step process if necessary: capture a first waveform based on the driver edge amplitude and a second one that effectively zooms in on the coupled crosstalk voltage.

In some implementations, the systems described herein can look for crosstalk using multiple transmitters over multiple channels and look at the coupling of the crosstalk on a single channel using that channel's detector. The systems can also include a single transmitter on one channel and look for crosstalk on multiple receivers at the same time, and can identify a particular combination of transmitters that cause crosstalk on a particular combination of detecting channels.

Process 61 may be performed for adjacent transmission lines in a test system or for any transmission lines that are not adjacent, but rather within a predefined group of transmission lines of within a predefined distance or vicinity of a transmission line on which a signal is driven. For example, a signal may be driven on a transmission line and two, three, four, or more transmission lines on either side may be tested for crosstalk in the manner described with respect to process 61.

Figure 10:
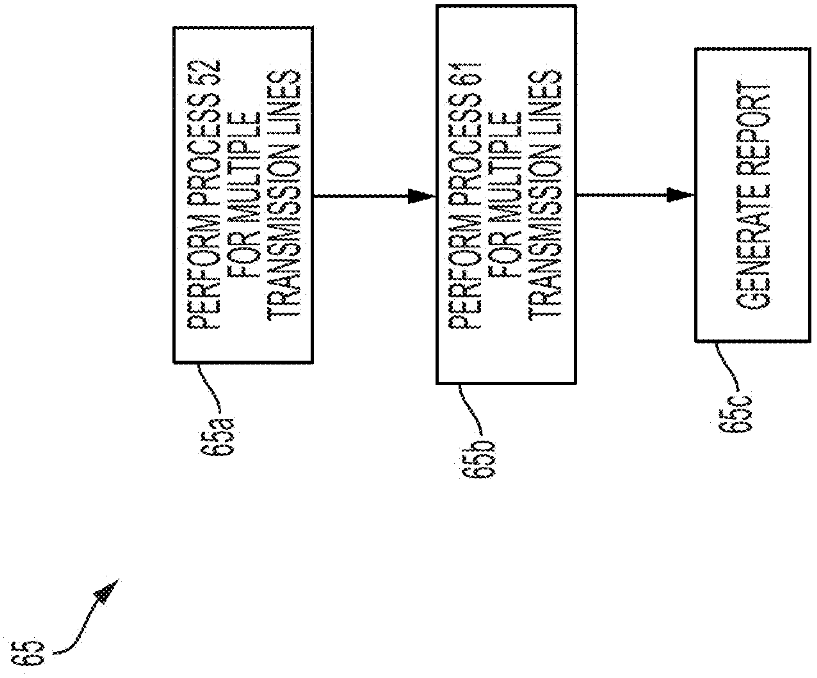
FIG. 10 is a flowchart showing example operations included in an example process that combines the processes of FIGS. 5 and 9.

Referring to FIG. 10, process 65 includes performing (65*a*) process 52 of FIG. 5 multiple times for multiple transmission lines and performing (65*b*) process 61 of FIG. 9 multiple times for multiple transmission lines. Each of process 52 and 61 may cycled through an entire set, or a subset, of transmission lines in a test system. Process 65 may generate and output (65*c*) a report, which may include the information reported from process 52 and the information reported from process 61. Ranges of values and tolerances therefor may be set to identify one or more attributes of each transmission line and faults thereof. These ranges and tolerances therefor may be programmed by a user into the test system, e.g., into a test program.

By way of example, test system 10, configured to implement process 65, may cycle through all of its transmission lines automatically in attempts to identify all or some of the possible faults that could be detected on those transmission lines using the techniques described herein including, but not limited to, hard transmission line faults, crosstalk faults, and intermittent faults. The automatic cycling may be implemented by, and controlled by, a test program executing on the test instrument. The report generated and output (65*c*) by process 65 may contain information identifying locations of all or some of these faults on one or more transmission lines and data associated with each fault. For example, if an intermittent fault is identified on a transmission line, the location of that intermittent fault may be identified textually or graphically and information on which the location of the intermittent fault is based may be included. For example, the information may indicate that a location of the fault exhibited 50Ω for one data capture for an instance of a waveform and that same location exhibited 70Ω for another data capture for a different instance of the same waveform.

Figure 15:
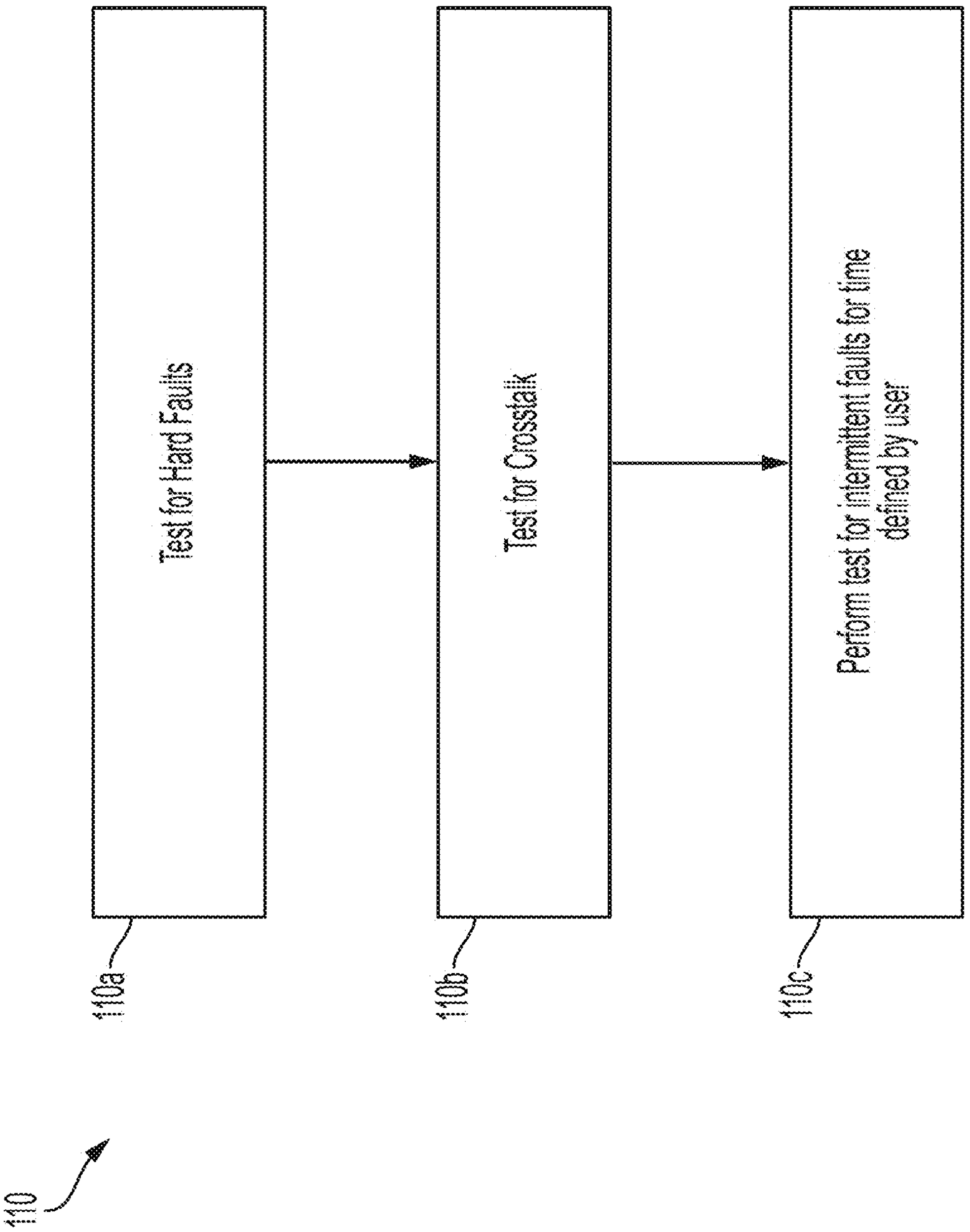
FIG. 15 is a flowchart showing example operations included in an example process for automated detection of different types of intermittent faults.

FIG. 15 shows an example process 110 for a series of test designed for detecting various types of faults. Example process 110 may be performed using test system 10, test instrument 21, and pin electronics 22 as described herein. Process 110 include pin electronics 22, in conjunction with test instrument 21 and/or test system 10 performing (110*a*) one or more tests for hard transmission line faults using, e.g., process 52 of FIG. 5, on one or more transmission lines, and performing (110*b*) one or more tests for crosstalk using, e.g., process 61 of FIG. 9, on one more transmission lines. Operations 110*a* and 110*b* may be repeated continuously, periodically, or intermittently to test for intermittent faults on each transmission line in the manner described herein. The duration of testing, the periodicity, or the times at which operations 110*a* and 110*b* are performed may be programmed by the user into a test system or part of a test program. A report may be generated of the type described herein identifying the intermittent faults.

An example system may have 32 channels and FIG. 15 shows an example method to determine what type of fault each channel may have. Since different test limits may exist for different types of tests, automation allows a user to obtain a quick diagnostic of all the interconnects between the ATE and DUT. The interconnect diagnostic may find faults that may otherwise show up as failures of their test programs for DUTs. The test programs may have a test fail indicating a bad DUT when the actual fault was in the interconnect between the ATE and DUT. The test system, which may include as a digital test instrument, can be reconfigured to test for transmission line faults allowing for a user to test for faults on digital channels and narrow the fault found to an interconnect between the ATE and DUT.

Figure 11:
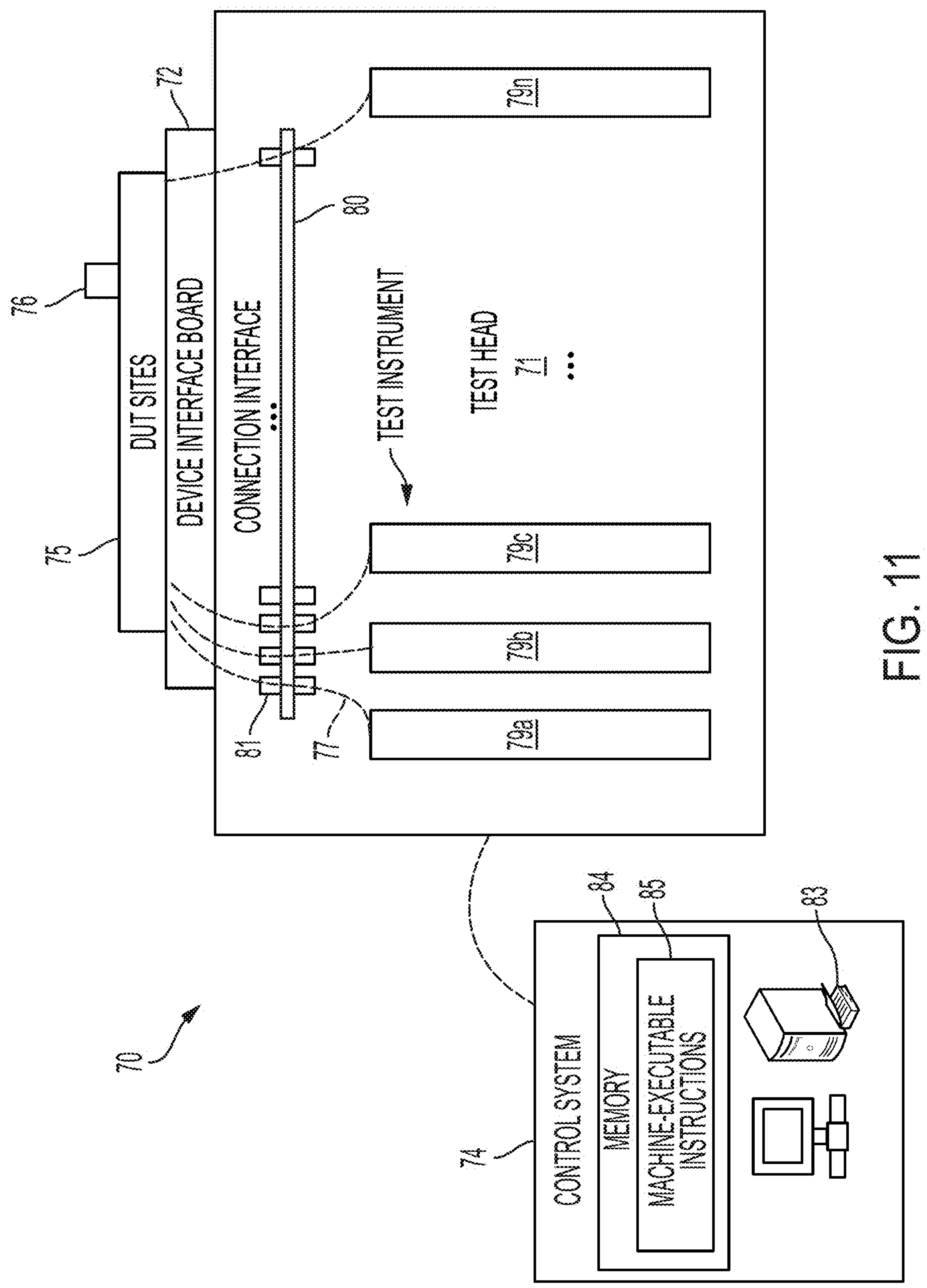
FIG. 11 is a block diagram of an example test system that may be configured to perform the processes of FIGS. 5, 9, 10 and/or 15.

FIG. 11 shows components of example automatic test equipment (ATE) 70 that may be an example implementation of the test system 10 of FIGS. 1, 3, and 8. ATE 70 includes a test head 71, a device interface board (DIB) 72 and a control system 74.

DIB 72 is connected to test head 71 and includes mechanical and electrical interfaces at sites 75 to one or more DUTs, such as DUT 76, that are being tested or are to be tested by the ATE. Power, including voltage, may be run via one or more layers in the DIB to DUTs connected to the DIB. DIB 72 also may include one or more ground layers and one or signal layers with connected vias for transmitting signals to the DUTs.

Test signals and response signals, such as RF signals, and other types of signals pass via test channels 77 to the sites between the DUTs and various test instruments over DIB 72. Examples of test channels 77 are shown in FIGS. 1, 3, and 8. DIB 72 may also include, among other things, connectors, conductive traces, conductive layers, and circuitry for routing signals between the test instruments, DUTs connected to sites 76, and other circuitry. In some implementations, particularly for larger form-factor DUTs such as airplane avionics or vehicle electronics, the DIB may be omitted and test channels may be routed directly from the test instruments to the DUTs.

Control system 74 communicates with components included in the test head to control testing. For example, control system 74 may download test program sets to test instruments 79*a*, 79*b*, 79*c*, and 79*n* in the test head. Test instrument 21 is an example of test instruments 79*a*, 79*b*, 79*c*, and 79*n*. In an example, a test program generates a test pattern (or flow) to provide to the DUT. The test pattern is written to output test signals to elicit a response from the DUT, for example. As noted, the test signals and the response from the DUT may include digital signals.

As indicated above, the test instruments include hardware devices that may include one or more processing devices, pin electronics, and programmable logic, such as an FPGA. Test instruments 79*a* to 79*n* may run the test program sets to test DUTs held on the DIB, which testing includes, but is not limited to, the TDR and crosstalk testing of processes 51, 61, and 65. Control system 74 may also send, to test instruments in the test head, instructions, test data, and/or other information that is usable by the test instruments to perform appropriate tests on DUTs interfaced to the DIB. In some implementations, this information may be sent via a computer or other type of network or via a direct electrical path. In some implementations, this information may be sent via a local area network (LAN) or a wide area network (WAN).

Test instruments 79*a* to 79*n* may each include tens, hundreds, or thousands of instances of pin electronics, and be connected to respective test channels to a DUT, to perform one or more of testing and/or other functions. Although only four test instruments are depicted, the system may include any appropriate number of test instruments, including those residing outside of test head 71. Signals, including RF, AC, and DC signals, may be sent to, and received from, the DUT over multiple test channels or other electrically conductive media.

In some examples, a test channel may include the physical transmission medium or media over which signals are sent from the test instrument to a DUT and over which signals are received from the DUT. Physical transmission media may include, but are not limited to, electrical conductors alone or in combination with optical conductors, wireless transmission media, or both optical conductors and wireless transmission media. In some examples, a test channel may include a range of frequencies over which signals are transmitted over one or more physical transmission media.

In some examples, ATE 70 includes a connection interface 80 that connects test instrument test channels 77 to DIB 72. Connection interface 80 may include connectors 81 for routing signals between the test instruments and DIB 72. The connection interface may include one or more circuit boards or other substrates on which such connectors are mounted. Conductors that are included in the test channels may be routed through the connection interface and the DIB.

Control system 74 may include one or more processing devices 83 and memory 84 storing instructions that are executable. The one or more processing devices 83 may execute instructions 85 to control, or to implement at least part of, processes 52, 61, and 65.

Although electrical transmission lines are described herein, the systems and processes 52, 61, and 65 described herein may also be used with optical transmission line assemblies, comprised of two or more optical media connected by a connector.

All or part of the systems and processes described herein including but not limited to processes 52, 61, and 65, and its modifications may be configured and/or controlled at least in part by one or more computers using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a system 100.

Actions associated with configuring or controlling the test system and processes described herein can be performed by one or more programmable processors executing one or more computer programs to control or to perform all or some of the operations described herein. All or part of the test systems and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

All examples described herein are non-limiting.

In the description and claims provided herein, the adjectives "first", "second", "third", and the like do not designate priority or order unless context suggests otherwise. Instead, these adjectives may be used solely to differentiate the nouns that they modify.

Any mechanical or electrical connection herein may include a direct physical connection or an indirect physical connection that includes one or more intervening components. A connection between two electrically conductive components includes an electrical connection unless context suggests otherwise.

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. Automatic test equipment (ATE) comprising:

a transmitter to output a signal to produce a waveform on a transmission line;

circuitry to obtain data for the waveform on the transmission line, the waveform comprising a reflected waveform, the circuitry being configured to scan the waveform across a range of times and across a range of voltages to obtain the data for the waveform;

memory to store the data obtained by the circuitry; and one or more processing devices configured to perform operations comprising:

creating, from the data stored in memory, a two-by-two array using data from the scan across the range of times and the scan across the range of voltages;

constructing an approximation of the waveform using data from the two-by-two array; and identifying an attribute of the transmission line based on the approximation of the waveform.

2. The ATE of claim 1, wherein the circuitry is configured to obtain the data at more than one time in the range of times.

3. The ATE of claim 1, wherein the circuitry comprises delay elements to affect scanning across the range of times and has a threshold that is settable to different values to affect scanning across the range of voltages.

4. The ATE of claim 3, wherein, to obtain the data for the waveform, the circuitry is configured to perform operations comprising:

(a) receiving a value for the threshold;

(b) for the value of the threshold that was received, performing operations comprising:

(i) sampling the waveform at times in the range that are separated by a time period to obtain data for the waveform;

(ii) incrementing the times using a delay element to produce incremented times, the delay element adding a delay to each time, the delay being a fraction of the time period;

(iii) repeating operations (i) and (ii) a predetermined number of times, each time replacing the times with the incremented times;

(c) obtaining an updated value for the threshold; and (d) repeating operations (a) through (c) a predetermined number of times, each time using the updated value for the threshold as the value for the threshold.

5. The ATE of claim 4, wherein operations (a) through (c) are repeated for values of the threshold that extend at least from a lowest value of the waveform to a highest value of the waveform.

6. The ATE of claim 4, wherein a number of values of the threshold is less than, or less than or equal to, a number of values for the times.

7. The ATE of claim 4, wherein a number of values of the threshold is greater than, or greater than or equal to, a number of values for the times.

8. The ATE of claim 4, wherein the circuitry comprises a hardware device, the delay elements comprise hardware elements in the hardware device, and the threshold is programmable into the hardware device.

9. The ATE of claim 4, wherein the predetermined number of times that operations (i) and (ii) are repeated is based on the time period and the delay.

10. The ATE of claim 9, wherein the predetermined number of times that operations (i) and (ii) are repeated comprises a number of delays summed to reach the time period minus a single delay.

11. The ATE of claim 1, further comprising:

a test instrument comprising pin electronics associated with a communication channel to a device under test (DUT), the transmitter being implemented on the pin electronics.

12. The ATE of claim 1, wherein the waveform comprises an edge.

13. The ATE of claim 12, wherein the attribute comprises an impedance of the transmission line or part of the transmission line.

14. The ATE of claim 12, wherein the attribute comprises a length of the transmission line.

15. The ATE of claim 1, wherein identifying the attribute comprises:

identifying one or more segments of the transmission line based on the data;

identifying an attribute for each of the one or more segments; and determining whether each of the one or more segments is within an acceptable tolerance based a corresponding attribute.

16. The ATE of claim 1, wherein identifying the attribute comprises:

analyzing the approximation of the waveform to obtain information about the transmission line; and outputting the information about the transmission line.

17. The ATE of claim 16, wherein the information comprises at least one of: (i) a location of an open circuit on the transmission line, (ii) a location of a short circuit on the transmission line, (iii) one or more impedances on the transmission line, or (iv) a length of the transmission line or a segment of the transmission line.

18. The ATE of claim 1, wherein the circuitry is configured to obtain data for multiple instances of the waveform on the transmission line and to store the data for the multiple instances of the waveform in the memory; and wherein the one or more processing devices are configured to compare the data for the multiple instances of the waveform based on a test limit and to determine whether there is an intermittent fault on the transmission line based on the comparison.

19. The ATE of claim 1, wherein identifying the attribute comprises:

analyzing the approximation of the waveform to obtain information about the transmission line; and detecting a fault on the transmission line by comparing the information to one or more test limits programmed into the ATE.

20. The ATE of claim 1, further comprising multiple transmitters, each transmitter to output a signal to produce a waveform on a respective transmission line, the transmitter being among the multiple transmitters; and multiple instances of the circuitry to obtain data for respective waveforms on respective transmission lines, the circuitry being among the multiple instances, each instance of the circuitry being configured to scan the respective waveform across a range of times and across a range of voltages to obtain respective data for the respective waveform and to store the respective data in the memory;

wherein the one or more processing devices are configured to analyze the respective data for the respective waveforms to attempt to identify at least one of a hard transmission line fault, a crosstalk fault, or an intermittent fault.

21. The ATE of claim 1, wherein the one or more processing devices are configured to perform operations comprising:

detecting a fault in an interconnect on the transmission line.

22. The ATE of claim 1, wherein the circuitry and the one or more processing devices are both part of a pin electronics circuit.

23. The ATE of claim 1, wherein the one or more processing devices are part of the circuitry.

24. The ATE of claim 23, wherein the one or more processing devices comprise programmable logic.

25. The ATE of claim 1, wherein the circuitry comprises a pin electronic circuit and the one or more processing devices are separate from the pin electronic circuit.

26. The ATE of claim 1, wherein the circuitry comprises a pin electronic circuit and the one or more processing devices are shared between the pin electronics circuit and another pin electronics circuit.

27. Automatic test equipment (ATE) comprising:

a transmitter to output a signal to produce a waveform on a transmission line;

circuitry to detect data for the waveform on the transmission line, the waveform comprising a reflected waveform, the circuitry being configured to scan the waveform across a range of times and across a range of voltages to detect the data for the waveform, wherein the circuitry comprises delay elements to affect scanning across the range of times and has a threshold that is settable to different values to affect scanning across the range of voltages; and memory to store the data detected by the circuitry;

wherein, to detect the data for the waveform, the circuitry is configured to perform operations comprising:

(a) receiving a value for the threshold;

(b) for the value of the threshold that was received, performing operations comprising:

(i) sampling the waveform at times in the range that are separated by a time period to obtain data for the waveform;

(ii) incrementing the times using a delay element to produce incremented times, the delay element adding a delay to each time, the delay being a fraction of the time period;

(iii) repeating operations (i) and (ii) a predetermined number of times, each time replacing the times with the incremented times;

(c) obtaining an updated value for the threshold; and (d) repeating operations (a) through (c) a predetermined number of times, each time using the updated value for the threshold as the value for the threshold.

28. The ATE of claim 27, wherein operations (a) through (c) are repeated for values of the threshold that extend at least from a lowest value of the waveform to a highest value of the waveform.

29. The ATE of claim 27, wherein a number of values of the threshold is less than, or less than or equal to, a number of values for the times.

30. The ATE of claim 27, wherein a number of values of the threshold is greater than, or greater than or equal to, a number of values for the times.

31. The ATE of claim 27, wherein the circuitry comprises a hardware device, the delay elements comprise hardware elements in the hardware device, and the threshold is programmable into the hardware device.

32. The ATE of claim 27, wherein the predetermined number of times that operations (i) and (ii) are repeated is based on the time period and the delay.

33. The ATE of claim 32, wherein the predetermined number of times that operations (i) and (ii) are repeated comprises a number of delays summed to reach the time period minus a single delay.

34. Automatic test equipment (ATE) comprising:

a transmitter to output a signal to produce a waveform on a transmission line;

detecting means for detecting data for the waveform on the transmission line, the waveform comprising a reflected waveform, the detecting means for scanning the waveform across a range of times and across a range of voltages to obtain the data for the waveform;

memory to store the data detected by the circuitry; and processing means for performing operations comprising:

creating, from the data stored in memory, a two-by-two array using data from the scan across the range of times and the scan across the range of voltages;

constructing an approximation of the waveform using data from the two-by-two array; and identifying an attribute of the transmission line based on the approximation of the waveform.

* * * * *